United States Patent
Wang

(10) Patent No.: US 7,719,050 B1
(45) Date of Patent: *May 18, 2010

(54) LOW POWER ELECTRICALLY ALTERABLE NONVOLATILE MEMORY CELLS AND ARRAYS

(76) Inventor: Chih-Hsin Wang, 6585 Gillis Dr., San Jose, CA (US) 95120

( * ) Notice: Subject to any disclaimer, the term of this patent is extended or adjusted under 35 U.S.C. 154(b) by 112 days.

This patent is subject to a terminal disclaimer.

(21) Appl. No.: 12/157,380

(22) Filed: Jun. 10, 2008

Related U.S. Application Data

(63) Continuation of application No. 11/234,646, filed on Sep. 23, 2005, now Pat. No. 7,411,244, which is a continuation-in-part of application No. 11/169,399, filed on Jun. 28, 2005, now Pat. No. 7,550,800.

(51) Int. Cl.
   - H01L 29/06 (2006.01)
   - H01L 29/76 (2006.01)
   - H01L 21/336 (2006.01)

(52) U.S. Cl. ............... 257/316; 257/315; 257/321; 257/324; 257/E21.17; 257/E21.68; 257/E21.331; 365/185.18; 438/257; 438/259; 438/261; 438/700

(58) Field of Classification Search ............ 257/315, 257/316, 324, E21.17, E21.68; 365/185.18; 438/257, 259

See application file for complete search history.

(56) References Cited

U.S. PATENT DOCUMENTS

| | | |
|---|---|---|
| 3,943,543 A | 3/1976 | Caywood |
| 3,944,849 A | 3/1976 | Tasch, Jr. et al. |
| 4,072,977 A | 2/1978 | Bate et al. |
| 4,462,090 A | 7/1984 | Iizuka et al. |
| 4,698,787 A | 10/1987 | Mukherjee et al. |
| 4,957,877 A | 9/1990 | Tam et al. |
| 5,029,130 A | 7/1991 | Yeh |
| 5,053,839 A | 10/1991 | Esquivel et al. |
| 5,070,480 A | 12/1991 | Caywood |
| 5,095,344 A | 3/1992 | Harari |
| 5,115,289 A | 5/1992 | Hisamoto et al. |
| 5,146,426 A | 9/1992 | Mukherjee et al. |
| 5,153,880 A | 10/1992 | Owen et al. |

(Continued)

OTHER PUBLICATIONS

Bock et al; "3.3ps SiGe Bipolar Technology," Proceeding of the IEDM, pp. 255-258; 2004.

(Continued)

*Primary Examiner*—Dao H Nguyen

(57) ABSTRACT

A memory cell comprises a body of a semiconductor material having a first conductivity type. A conductor-filter system includes a first conductor having thermal charge carriers, and a filter contacting the first conductor and including dielectrics for providing a filtering function on the charge carriers of one polarity. The filter includes a first set of electrically alterable potential barriers. A conductor-insulator system includes a second conductor and a first insulator contacting the second conductor at an interface and having a second set of electrically alterable potential barriers. A first region is spaced-apart from the second conductor. A channel of the body is defined therebetween. A second insulator is adjacent to the first region. A charge storage region is disposed in between the first and the second insulators. A word-line has a first portion and a second portion comprising the first conductor disposed over and insulated from the body.

34 Claims, 12 Drawing Sheets

U.S. PATENT DOCUMENTS

| | | | |
|---|---|---|---|
| 5,161,157 A | 11/1992 | Owen et al. |
| 5,235,544 A | 8/1993 | Caywood |
| 5,268,319 A | 12/1993 | Harari |
| 5,270,980 A | 12/1993 | Pathak et al. |
| 5,280,446 A | 1/1994 | Ma et al. |
| 5,286,994 A | 2/1994 | Ozawa et al. |
| 5,426,316 A | 6/1995 | Mohammad |
| 5,429,965 A | 7/1995 | Shimoji |
| 5,432,739 A | 7/1995 | Pein |
| 5,517,044 A | 5/1996 | Koyama et al. |
| 5,523,243 A | 6/1996 | Mohammad |
| 5,557,122 A | 9/1996 | Shrivastava et al. |
| 5,559,735 A | 9/1996 | Ono et al. |
| 5,563,083 A | 10/1996 | Pein |
| 5,621,738 A | 4/1997 | Caywood et al. |
| 5,714,766 A | 2/1998 | Chen et al. |
| 5,739,567 A | 4/1998 | Wong |
| 5,764,096 A | 6/1998 | Lipp et al. |
| 5,768,192 A | 6/1998 | Eitan |
| 5,780,341 A | 7/1998 | Ogura |
| 5,790,455 A | 8/1998 | Caywood |
| 5,792,670 A | 8/1998 | Pio et al. |
| 5,822,242 A | 10/1998 | Chen |
| 5,838,039 A | 11/1998 | Sato et al. |
| 5,847,427 A | 12/1998 | Hagiwara |
| 5,847,996 A | 12/1998 | Guterman et al. |
| 5,883,409 A | 3/1999 | Guterman et al. |
| 5,966,329 A | 10/1999 | Hsu et al. |
| 5,973,356 A | 10/1999 | Noble et al. |
| 6,002,152 A | 12/1999 | Guterman et al. |
| 6,080,995 A | 6/2000 | Nomoto |
| 6,088,263 A | 7/2000 | Liu et al. |
| 6,091,104 A | 7/2000 | Chen |
| 6,103,573 A | 8/2000 | Harari |
| 6,104,057 A | 8/2000 | Nakanishi et al. |
| 6,201,732 B1 | 3/2001 | Caywood |
| 6,211,562 B1 | 4/2001 | Forbes et al. |
| 6,303,940 B1 | 10/2001 | Kizilyalli et al. |
| 6,313,487 B1 | 11/2001 | Kencke et al. |
| 6,368,915 B1 | 4/2002 | Montree et al. |
| 6,372,617 B1 | 4/2002 | Kitamura |
| 6,384,451 B1 | 5/2002 | Caywood |
| 6,388,922 B1 | 5/2002 | Fujiwara et al. |
| 6,407,424 B2 | 6/2002 | Forbes |
| 6,411,545 B1 | 6/2002 | Caywood |
| 6,426,896 B1 | 7/2002 | Chen |
| 6,449,189 B2 | 9/2002 | Mihnea et al. |
| 6,451,652 B1 | 9/2002 | Caywood et al. |
| 6,469,343 B1 | 10/2002 | Mura et al. |
| 6,479,863 B2 | 11/2002 | Caywood |
| 6,503,785 B2 | 1/2003 | Chen |
| 6,525,371 B2 | 2/2003 | Johnson |
| 6,525,962 B1 | 2/2003 | Pai et al. |
| 6,531,731 B2 | 3/2003 | Jones et al. |
| 6,534,816 B1 | 3/2003 | Caywood |
| 6,555,865 B2 | 4/2003 | Lee |
| 6,566,706 B1 | 5/2003 | Wang et al. |
| 6,574,140 B2 | 6/2003 | Caywood |
| 6,580,124 B1 | 6/2003 | Cleeves et al. |
| 6,580,642 B1* | 6/2003 | Wang .................. 365/185.18 |
| 6,593,624 B2 | 7/2003 | Walker |
| 6,621,107 B2 | 9/2003 | Blanchard et al. |
| 6,680,505 B2 | 1/2004 | Ohba et al. |
| 6,709,928 B1 | 3/2004 | Jenne et al. |
| 6,721,205 B2 | 4/2004 | Kobayashi et al. |
| 6,727,545 B2 | 4/2004 | Wang et al. |
| 6,734,105 B2 | 5/2004 | Kim |
| 6,743,674 B2 | 6/2004 | Wang |
| 6,744,111 B1 | 6/2004 | Wu |
| 6,745,370 B1 | 6/2004 | Segal et al. |
| 6,747,310 B2 | 6/2004 | Fan |
| 6,753,568 B1 | 6/2004 | Nakazato et al. |
| 6,756,633 B2 | 6/2004 | Wang et al. |
| 6,774,433 B2 | 8/2004 | Lee et al. |
| 6,790,727 B2 | 9/2004 | Jones et al. |
| 6,791,883 B2 | 9/2004 | Swift et al. |
| 6,815,764 B2* | 11/2004 | Bae et al. ..................... 257/324 |
| 6,847,556 B2 | 1/2005 | Cho |
| 6,853,583 B2 | 2/2005 | Diorio et al. |
| 6,861,698 B2 | 3/2005 | Wang |
| 6,873,006 B2 | 3/2005 | Chen et al. |
| 6,882,572 B2 | 4/2005 | Wang et al. |
| 6,894,339 B2 | 5/2005 | Fan et al. |
| 6,894,343 B2 | 5/2005 | Harari et al. |
| 6,897,514 B2 | 5/2005 | Kouznetsov et al. |
| 6,936,884 B2 | 8/2005 | Chae et al. |
| 6,936,887 B2 | 8/2005 | Harari et al. |
| 6,952,032 B2 | 10/2005 | Forbes et al. |
| 6,952,033 B2 | 10/2005 | Kianian et al. |
| 6,953,970 B2 | 10/2005 | Yuan et al. |
| 6,958,513 B2 | 10/2005 | Wang |
| 7,015,102 B2 | 3/2006 | Wang |
| 7,018,897 B2 | 3/2006 | Wang |
| 7,074,672 B2 | 7/2006 | Kianian et al. |
| 7,075,823 B2 | 7/2006 | Harari |
| 7,115,942 B2 | 10/2006 | Wang |
| 7,149,118 B2 | 12/2006 | Diorio et al. |
| 7,190,018 B2 | 3/2007 | Chen et al. |
| 7,259,984 B2 | 8/2007 | Kan et al. |
| 7,274,068 B2 | 9/2007 | Forbes |
| 7,297,634 B2 | 11/2007 | Wang |
| 7,307,308 B2 | 12/2007 | Lee et al. |
| 7,411,244 B2* | 8/2008 | Wang .......................... 257/316 |
| 7,550,800 B2* | 6/2009 | Wang .......................... 257/316 |
| 2001/0029077 A1 | 10/2001 | Noble et al. |
| 2002/0179958 A1 | 12/2002 | Kim |
| 2004/0021170 A1 | 2/2004 | Caywood |
| 2004/0160824 A1 | 8/2004 | Kianian et al. |
| 2004/0214396 A1 | 10/2004 | Wang et al. |
| 2005/0167734 A1 | 8/2005 | She et al. |
| 2006/0284236 A1 | 12/2006 | Bhattacharyya |

OTHER PUBLICATIONS

C. A. Mead, "The Tunnel-Emission Amplifier", Proceedingss of the IRE, pp. 359-361, 1960.

Caywood, John M. et al; "A Novel Nonvolatile Memory Cell Suitable for Both Flash and Byte-Writable Applications"; IEEE Transactions on Electron Devices, vol. 49, No. 5, May 2002; pp. 802-807.

First Examination Report from the State Intellectual Property Office of the People's Republic of China dated Aug. 30, 2007 for Chinese Application No. 2005/100804259; 9 pages.

First Examination Report from the State Intellectual Property Office of the People's Republic of China dated Sep. 6, 2007 for Chinese Application No. 2005/100804314; 8 pages.

Fischetti et al; "Six-band k.p calculation of hole mobility in silicon inversion layers: dependence on surface . . . ," Journal of Appl. Physics, vol. 94, pp. 1079-1095; 2003.

H. Fujiwara et al; "High-Efficiency Programming with Inter-Gate Hot-Electron Injection for Flash . . . ," Digest of Non-Volatile Semiconductor Memory Workshop, Feb. 2000; p. 127.

Hensel et al; "Cyclotron Resonance Experiments in Uniaxially Stressed Silicon; Valence Band Inverse Mass Parameters and Deformation . . . ," Phys. Rev. 129, pp. 1141-1062; 1963.

Hinckley et al; "Hole Transport Theory in Pseudomorphic Si1-xGex Allows Grown on Si(001) Substrates," Phys. Rev. B, 41, pp. 2912-2926; 1990.

Kitamura et al; "A Low Voltage Operating Flash Cell with High Coupling Ratio Using Horned Floating Gate with Fine HSG"; 1998 Symposium on FLSI Technology Digest of Technical Papers; pp. 104-105.

Kuo et al; "FEFET—A High Density, Low Erase Voltage, Trench Flash EEPROM"; 1994 Symposium on VLSI Technology Digest of Technigal Papers; pp. 51-52.

Lai, Stefan; "Flash Memories: Where We Were and Where We Are Going"; 1998 IEEE; pp. 971-973.

Lenzlinger and Snow; Fowler-Nordheim Tunneling into Thermally Grown SiO2; J. Appl. Phys. vol. 40, No. 1; Jan. 1969; pp. 278-283.

M. Heiblum et al; "Direct Observation of ballistic Transport in GaAs," pp. 2200-2203, vol. 55, Physical Review Letters; 1985.

Nicollian and Brews; "MOS Physics and Technology," Wiley-Interscience, 1982, "Photo I-V method—Basics"; pp. 512-515.

Pein, H. et al; "Performance of the 3-D Sidewall Flash EPROM Cell", IEDM Technical Digest, pp. 11-14, Dec. 1993.

S. Sze; "Physics of Semiconductor Devices"; Wiley-Interscience, 1981, "Schotky Effect", pp. 250-253.

SMA5111—Compound Semiconductors; Lecture 2—Metal-Semiconductor Junctions—Outline; C. G. Fonstad; Feb. 2003; 22 pages.

Vogelsang et al; "Electron Mobilities and High-Field Drift Velocity in Strained Silicon on Silicon-Germanium Substrate", IEEE Trans. on Electron Devices, pp. 2641-2642; 1992.

Wang, Chih Hsin; "Three-Dimensional DIBL for Shallow-Trench Isolated MOSFET's"; IEEE Transactions on Electron Devices, vol. 46, No. 1, Jan. 1999; pp. 139-144.

\* cited by examiner

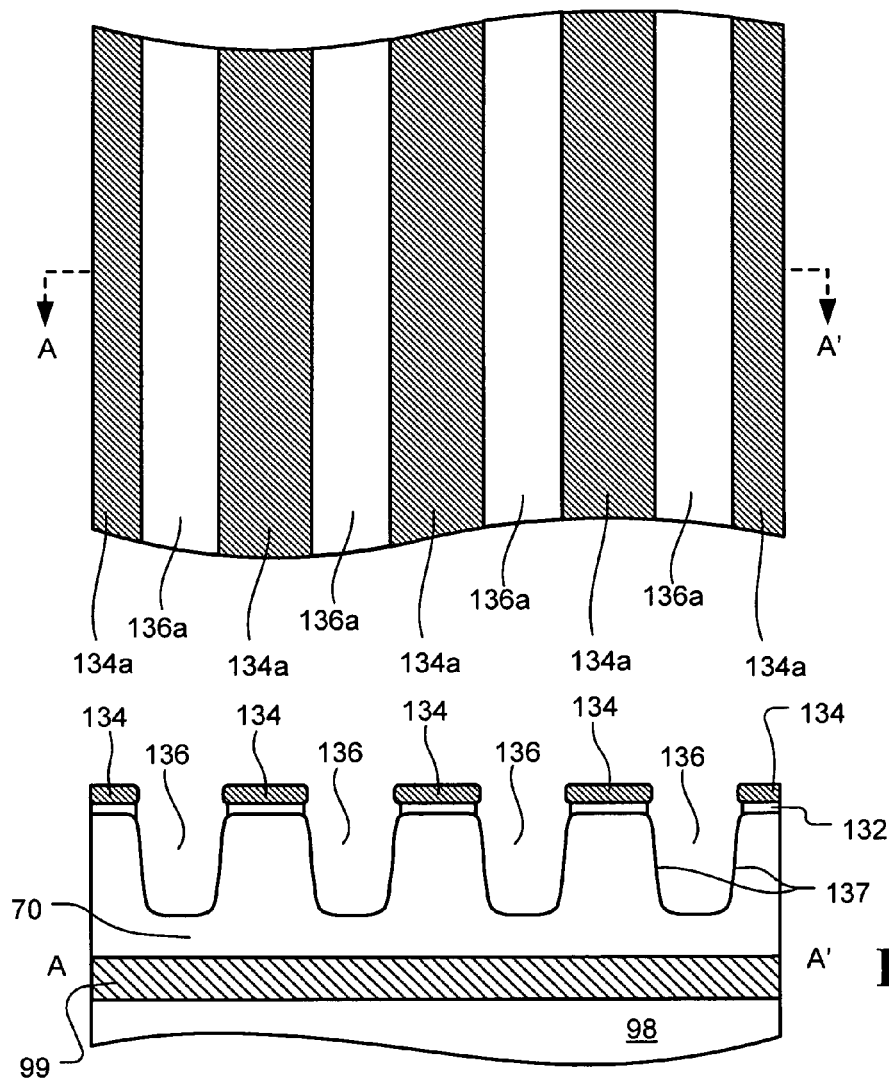
FIG. 12
FIG. 12A
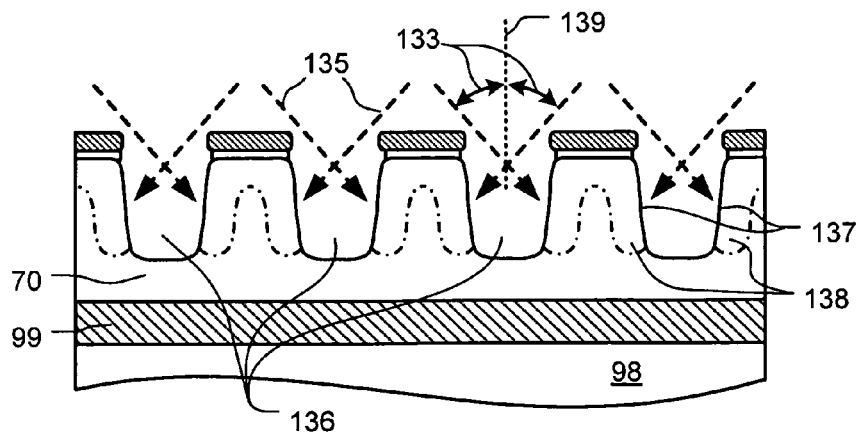
FIG. 13

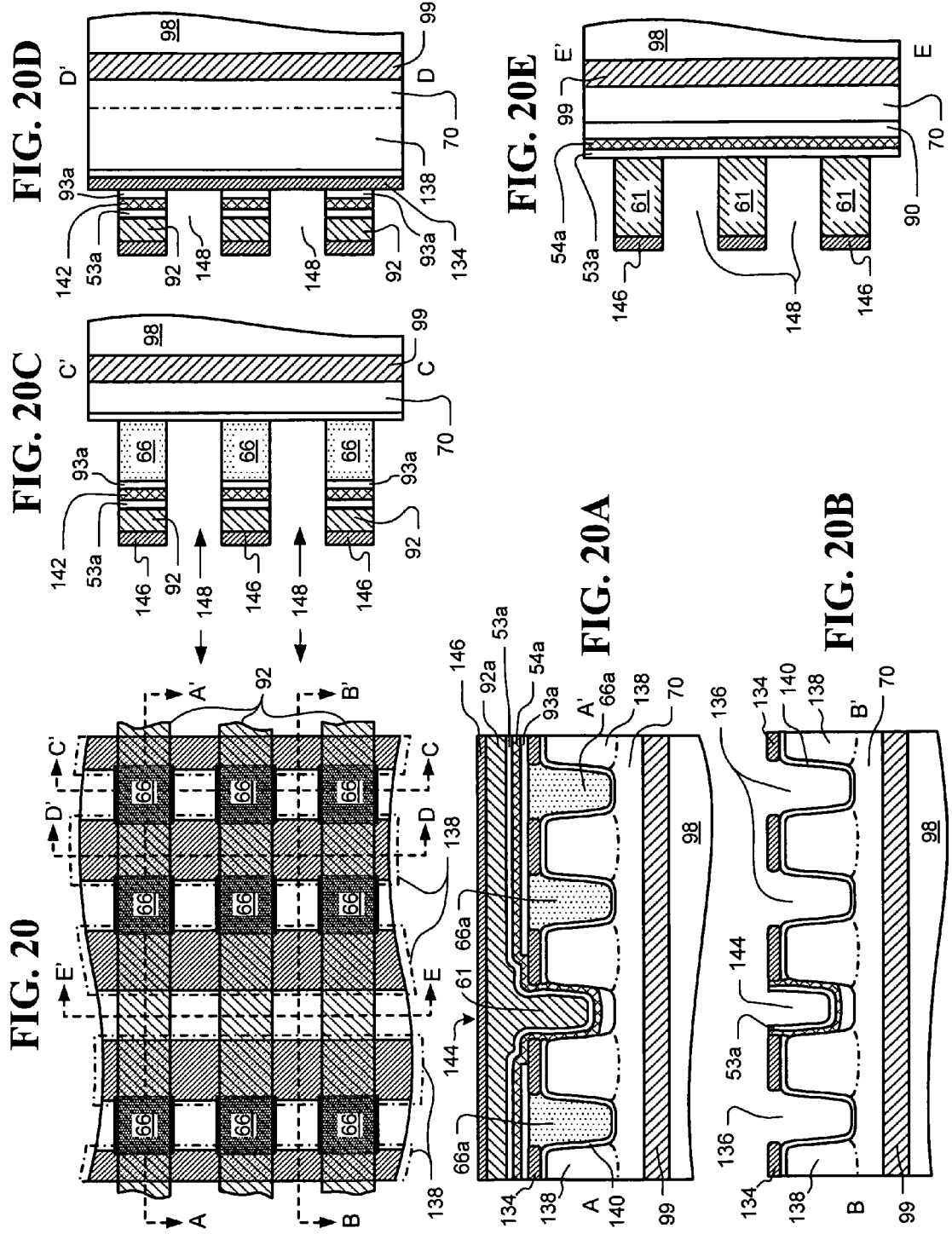

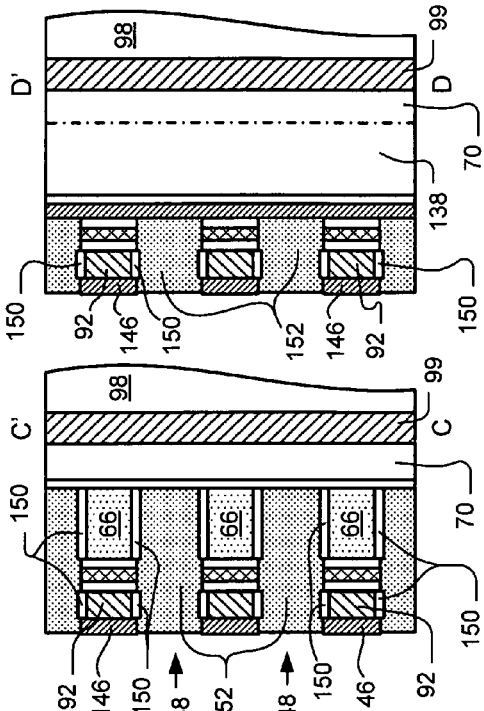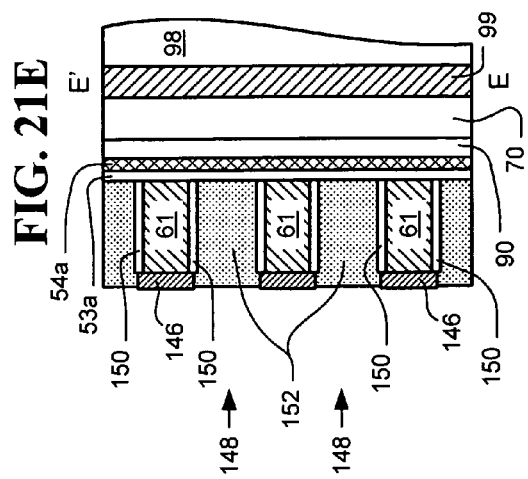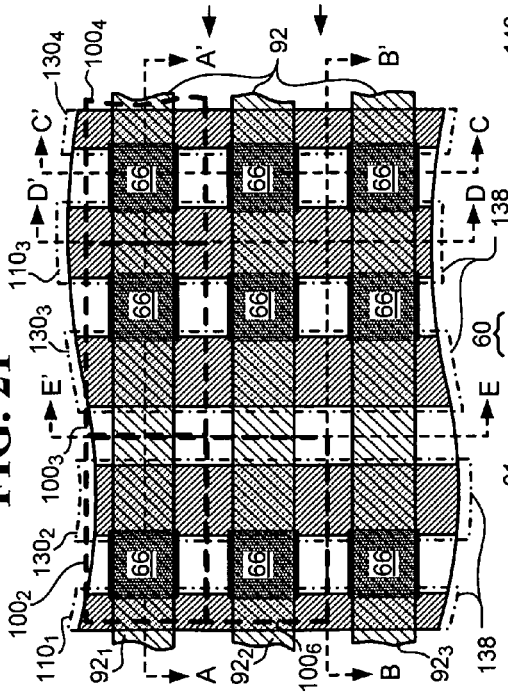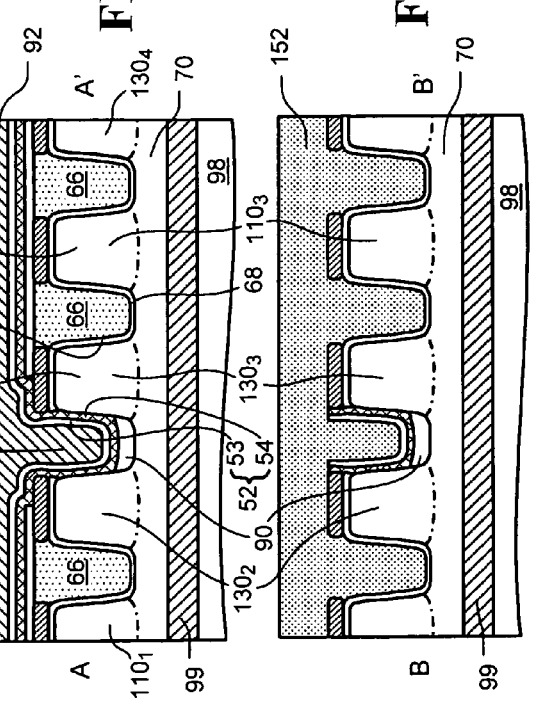

US 7,719,050 B1

LOW POWER ELECTRICALLY ALTERABLE NONVOLATILE MEMORY CELLS AND ARRAYS

RELATED APPLICATIONS

This application is a Continuation of U.S. patent application Ser. No. 11/234,646, filed Sep. 23, 2005, which is a Continuation-In-Part of U.S. patent application Ser. No. 11/169,399 filed Jun. 28, 2005. The disclosures of the above applications are incorporated herein by reference in their entirety.

TECHNICAL FIELD

The present invention deals with nonvolatile memory, and relates more specifically to Electrically Programmable Read Only Memories (EPROM) and Electrically Erasable and Programmable Read Only Memories (EEPROM). More particularly, the present invention relates to memory cell and array architectures and methods forming cells and arrays of nonvolatile memory devices.

BACKGROUND OF THE INVENTION

Nonvolatile semiconductor memory cells permitting charge storage capability are well known in the art. The charges are typically stored in a floating gate to define the states of a memory cell. Typically, the states can be either two levels or more than two levels (for multi-level states storage). Mechanisms such as channel hot electron injection (CHEI), source-side injection (SSI), Fowler-Nordheim tunneling (FN), and Band-to-Band Tunneling (BTBT) induced hot-electron-injection can be used to alter the states of such cells in program and/or erase operations. Examples on employing such mechanisms for memory operations can be seen in cell structures in U.S. Pat. Nos. 4,698,787, 5,029,130, 5,792,670, 5,146,426, 5,432,739 and 5,966,329.

All the above mechanisms and cell structures, however, have poor injection efficiency (defined as the ratio of number of carriers collected by the floating gate to the number of carriers supplied). Further, these mechanisms and cell structures require high voltages to support the memory operation, and voltage as high as 10V is often seen. It is believed that the high voltage demands stringent control on the quality of the insulator surrounding the floating gate. The memories operated under these mechanisms thus are vulnerable to manufacturing and reliability problems.

In light of the foregoing problems, it is an object of the present invention to provide improved cell structures that can be operated to enhance carrier injection efficiency and to reduce operation voltages. It is another object of the present invention to provide charge carriers (electrons or holes) transporting with tight energy distribution and high injection efficiency. Other objects of the inventions and further understanding on the objects will be realized by referencing to the specifications and drawings.

SUMMARY OF THE INVENTION

It is the object of the present invention to provide memory cell architectures and methods forming cells and arrays of nonvolatile memory cells.

Briefly, one embodiment of the present invention is a memory cell. The memory cell comprises a body of a semiconductor material having a first conductivity type, a conductor-filter system including a first conductor having thermal charge carriers and a filter contacting the conductor and including dielectrics for providing a filtering function on the charge carriers of one polarity. The filter includes a first set of electrically alterable potential barriers for controlling flow of the charge carriers of one polarity through the filter in one direction. The memory cells further comprises a conductor-insulator system including a second conductor having at least a portion thereof contacting the filter and having energized charge carriers from the filter, and a first insulator contacting the second conductor at an interface and having electrically alterable Image-Force potential barriers adjacent to the interface. Moreover, the memory cells further comprises a first region spaced-apart from the second conductor with a channel of the body defined there between, a second insulator adjacent to the first region, a charge storage region disposed in between the first and the second insulators, and a word-line of a conductor having a first portion disposed over and insulated from the charge storage region and a second portion comprising the first conductor disposed over and insulated from the body.

Briefly, another embodiment of the present invention is a memory cell. The memory cell comprises a body of a semiconductor material having a first conductivity type, a conductor-filter system including a first conductor having thermal charge carriers and a filter contacting the conductor and including dielectrics for providing a filtering function on the charge carriers of one polarity. The filter includes a first set of electrically alterable potential barriers for controlling flow of the charge carriers of one polarity through the filter in one direction, and a second set of electrically alterable potential barriers for controlling flow of charge carriers of an opposite polarity through the filter in another direction that is substantially opposite to the one direction. The memory cells further comprises a conductor-insulator system including a second conductor having at least a portion thereof contacting the filter and having energized charge carriers from the filter, and a first insulator contacting the second conductor at an interface and having electrically alterable Image-Force potential barriers adjacent to the interface. Moreover, the memory cells further comprises a first region spaced-apart from the second conductor with a channel of the body defined there between, a second insulator adjacent to the first region, a charge storage region disposed in between the first and the second insulators, and a word-line of a conductor having a first portion disposed over and insulated from the charge storage region and a second portion comprising the first conductor disposed over and insulated from the body. Additionally, the memory cell further comprises means transporting the energized charge carriers over the Image-Force potential barrier onto the charge storage region.

Briefly, an additional embodiment of the present invention is a nonvolatile memory array. The nonvolatile memory array comprises a substrate, and a plurality of nonvolatile memory cells on the substrate and arranged in a rectangular array of rows and columns. Each of the plurality of nonvolatile memory cells comprises a body of a semiconductor material having a first conductivity type, a conductor-filter system including a first conductor having thermal charge carriers and a filter contacting the conductor and including dielectrics for providing a filtering function on the charge carriers of one polarity. The filter includes a first set of electrically alterable potential barriers for controlling flow of the charge carriers of one polarity through the filter in one direction, and a second set of electrically alterable potential barriers for controlling flow of charge carriers of an opposite polarity through the filter in another direction that is substantially opposite to the one direction. Each of the memory cells further comprises a conductor-insulator system including a second conductor having at least a portion thereof contacting the filter and having energized charge carriers from the filter, and a first insulator contacting the second conductor at an interface and having electrically alterable Image-Force potential barriers adjacent to the interface. Moreover, each of the memory cells further comprises a first region spaced-apart from the second conductor with a channel of the body defined there between, a second insulator adjacent to the first region, a charge storage region disposed in between the first and the second insulators; and a third conductor having a first portion disposed over and insulated from the charge storage region and a second portion comprising the first conductor disposed over and insulated from the body.

The foregoing and other objects, features and advantages of the present invention will be apparent from the following detailed description in conjunction with the drawings.

BRIEF DESCRIPTION OF THE DRAWINGS

The invention is herein described, by ways of example only, with reference to the accompanying drawings, wherein

FIG. 12 is a top view of the structure showing the next step of FIG. 11A in the formation of a memory array and cells in accordance with the present invention;

FIGS. 12A-19 are cross sectional views taken along the line A-A' in FIG. 12 illustrating in sequence the next steps in processing to form the memory cells and array in accordance with the present invention;

FIGS. 20 and 21 are top views of the structures showing in sequence the next step(s) in the formation of a memory array and cells in accordance with the present invention;

FIGS. 20A and 21A are cross sectional views taken along the line A-A' in FIGS. 20 and 21, respectively, illustrating in sequence the next steps in processing to form the memory cells and array in accordance with the present invention;

FIGS. 20B and 21B are cross sectional views taken along the line B-B' in FIGS. 20 and 21, respectively, illustrating in sequence the next steps in processing to form the memory cells and array in accordance with the present invention;

FIGS. 20C and 21C are cross sectional views taken along the line C-C' in FIGS. 20 and 21, respectively, illustrating in sequence the next steps in processing to form the memory cells and array in accordance with the present invention;

FIGS. 20D and 21D are cross sectional views taken along the line D-D' in FIGS. 20 and 21, respectively, illustrating in sequence the next steps in processing to form the memory cells and array in accordance with the present invention;

FIGS. 20E and 21E are cross sectional views taken along the line E-E' in FIGS. 20 and 21, respectively, illustrating in sequence the next steps in processing to form the memory cells and array in accordance with the present invention.

DETAILED DESCRIPTION OF THE INVENTION

As used herein, the term conductor represents conductive materials such as metal conductor and semiconductor. The symbol n+ indicates a heavily doped n-type semiconductor material typically having a doping level of n-type impurities (e.g. arsenic) on the order of $10^{20}$ atoms/cm$^3$. The symbol p+ indicates a heavily doped p-type semiconductor material typically having a doping level of p-type impurities (e.g. boron) on the order of $10^{20}$ atoms/cm$^3$. Where appropriate, the same reference indicators will be used throughout the drawings and the following detailed description to refer to the same or similar parts.

The memory cells of the present invention are constructed based on a conductor-insulator system and a conductor-filter system.

Figure 1A:
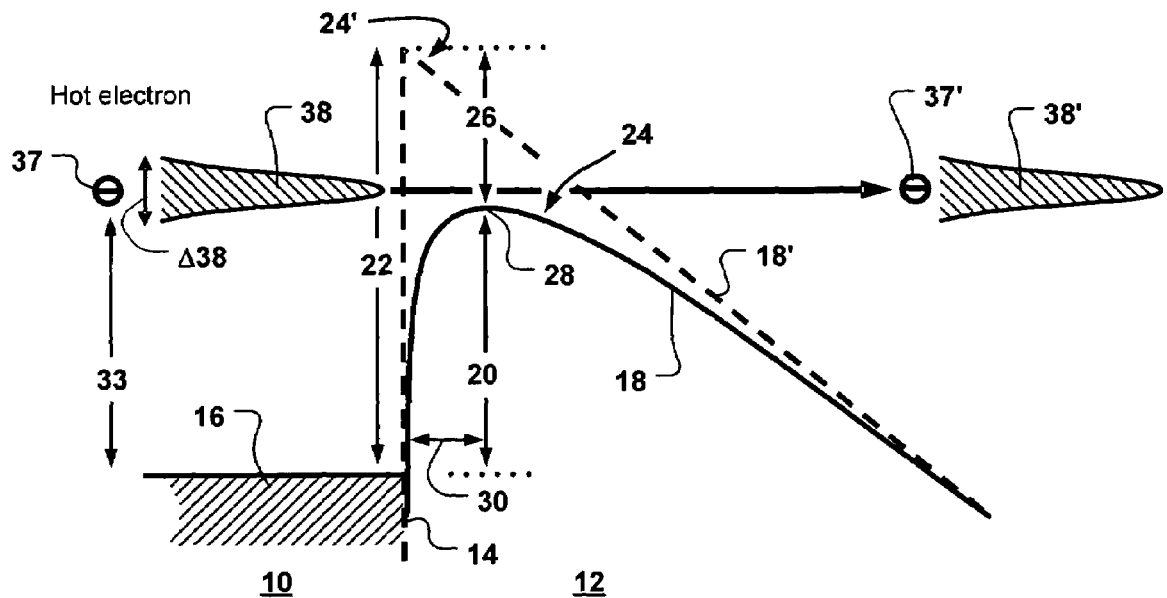
FIG. 1A is an energy band diagram showing hot electrons having narrow energy spectrum transporting through potential barrier in the energy-band of a conductor-insulator system in accordance with the present invention.

FIG. 1A presents the energy band diagram for a conductor-insulator system of the present invention showing energized charge carriers transporting over an Image-Force potential barrier 24 of the conductor-insulator system. The conductor-insulator system comprises a conductor 10 having energized charge carriers 37 with an energy distribution 38 and an insulator 12 contacting the conductor 10 at an interface 14 and having an Image-Force potential barrier 24 adjacent to the interface 14, wherein the Image-Force potential barrier 24 is electrically alterable to permit the energized charge carriers 37 transporting there over.

In FIG. 1A, the diagram shows the conductor 10 has a Fermi-level energy 16 in its energy-band. The energy-band of the insulator 12 is shown on conduction band 18 and the conductor-insulator system is shown having an Image-Force effect that alters the shape of a potential barrier from a triangle barrier 24' having a sharp corner at barrier edge to a triangle barrier 24 having a smooth corner (i.e. the "Image-Force potential barrier" or "Image-Force barrier"). The Image-Force effect is also termed Image-Force barrier lowering effect and the effect lowers the potential barrier from a barrier height $\phi_{bo}$ 22 to a barrier height $\phi_b$ 20 by a barrier offset $\Delta\phi_b$ 26. A barrier peak 28 is shown at the peak of the Image-Force barrier 24 having a location at a distance $X_m$ 30 away from an interface 14 between conductor 10 and insulator 12. A conduction band 18' is shown for cases without the Image-Force effect as a contrast.

In FIG. 1A, the energized charge carriers (hot electrons 37) are shown having energy distribution 38 on population distributed in a narrow energy spectrum Δ38 when transporting over Image-Force barrier 24 of conductor-insulator system. Further, the hot electrons 37 are shown having peak population at an energy level 33 with respect to the Fermi-level 16. Having such energy level 33, all of these electrons 37 are shown able to surmount the Image-Force barrier 24 to become electrons 37' having a distribution 38' on population similar to 38. In accordance with one embodiment of the present invention, typically, the energy distribution 38 of the energized charge carriers 37 has the energy spectrum Δ38 in the range of about 30 meV to about 300 meV.

The conductor-insulator system is characterized by the energized charge carriers 37 and the Image-Force effect on altering the barrier height 20 and the distance 30 of the barrier peak 28.

Figure 1B:
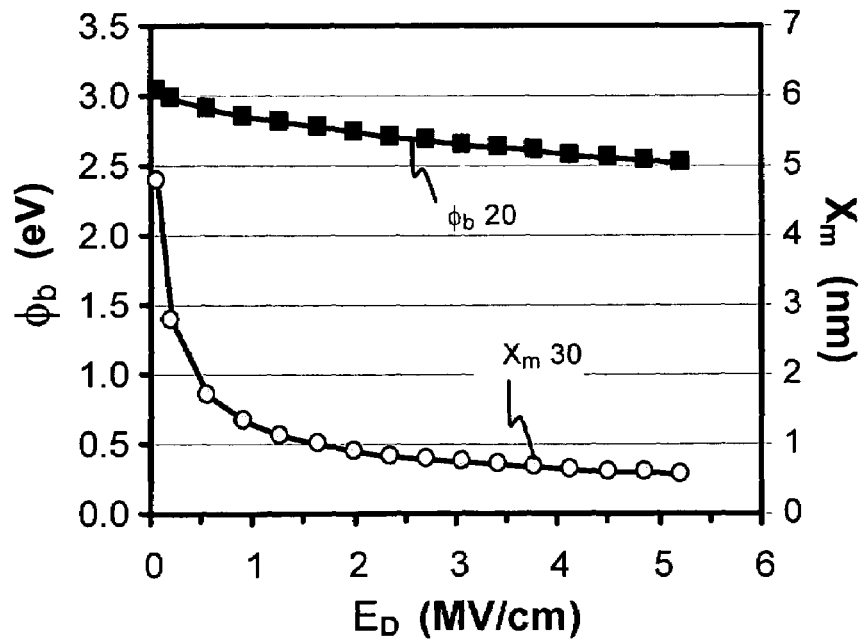
FIG. 1B shows barrier height and location of the barrier peak of the Image-Force potential barrier as a function of the dielectric field applied to the insulator.

FIG. 1B shows the effect of Image-Force on altering barrier height and location of the barrier peak of the Image-Force potential barrier. The barrier height 20 and location 30 of barrier peak are plotted as a function of electric field ED applied to the insulator. In illustrating the effect, oxide is assumed as the material for the insulator. FIG. 1B shows that the barrier height 20 can be lowered from 3.1 eV to about 2.5 eV when an electric field ED of about 5 MV/cm is applied to the insulator. This effect illustrates the Image-Force barrier lowering effect. Further, it illustrates the nature of the Image-Force potential barrier that the Image-Force potential barrier 24 is electrically alterable through electric field. Additionally, it illustrates a means on altering barrier height of the barrier 24 by using an electric field. Typically, such electric field is applied by applying a voltage across the insulator. For example, for an oxide insulator having 6 nm in thickness, a voltage of about 3.0V across the oxide is required to generate 5 MV/cm. This Image-Force effect provides the saving on electron kinetic energy made possible by the applied electric field because the Image-Force and the potential barrier must be combated only to a distance $X_m$ 30, and not to infinity. Once transporting beyond the distance $X_m$ 30, the energized charge carriers 37 are permitted to transport over the Image-Force barrier 24.

FIG. 1B further shows the peak barrier distance $X_m$ 30 to the conductor/insulator interface can be shortened from a range of infinity (at $\epsilon_D$=0 MV/cm) to a range less than 1 nm (at $\epsilon_D$=2 MV/cm). It is known in solid-state physics that the polarization of a medium (e.g. the insulator of FIG. 1A) cannot follow a moving charge when the transit time of the charge is shorter than the dielectric polarization time of the medium. Shortening peak barrier distance $X_m$, as provided in FIG. 1B, can shorten the charge transit time, and such effect is desirable as it can provide a means on lowering the dielectric constant of the Image-Force barrier 24 ("Image-Force dielectric constant") and hence a means on enhancing the barrier lowering effect. Other means, such as increasing charge moving velocity (e.g. by increasing its kinetic energy), can also be considered to reduce transit time, and hence reducing the Image-Force dielectric constant. This is considered as another means on altering barrier height of the Image-Force potential barrier. Typically, with such means, the dielectric constant can be lowered from its static value (e.g. about 3.9 for oxide) to a value near the optical one (e.g. about 2.2 for oxide), and results in an enhancement on lowering the Image-Force barrier 24 by about 0.14 eV (for oxide). It is noted that this effect is a result of a short transit time for carriers (electrons) 37 traversing the distance $X_m$ 30, and happens in the absence of interaction with other particles when the carrier transit time is shorter than the dielectric polarization time of the insulator. It is noted that in some situations, it is possible the carriers can interact with quantum mechanical particles (e.g. phonons) within the distance 30. Such interaction can result in the Image-Force dielectric constant of the barrier 24 be slightly larger than its optical one, and hence can slightly weaken the effect on barrier lowering as employing means provided herein.

The unique portion of the conductor-insulator system is that electrons 37 are packed in a tight energy distribution and the Image-Force barrier 24 functions as a "Full-Pass Filter" permitting all the hot electrons traversing there through at a lower kinetic energy. It thus brings advantages on higher injection efficiency and lower operation voltage to the system.

Although the forgoing illustrations are made for electrons as the energized charge carriers and conduction band as energy band of the barrier, it is obvious that the same illustrations can be readily made for other types of energized charge carriers, such as holes, and for other types of energy band, such as valence band.

Figure 2:
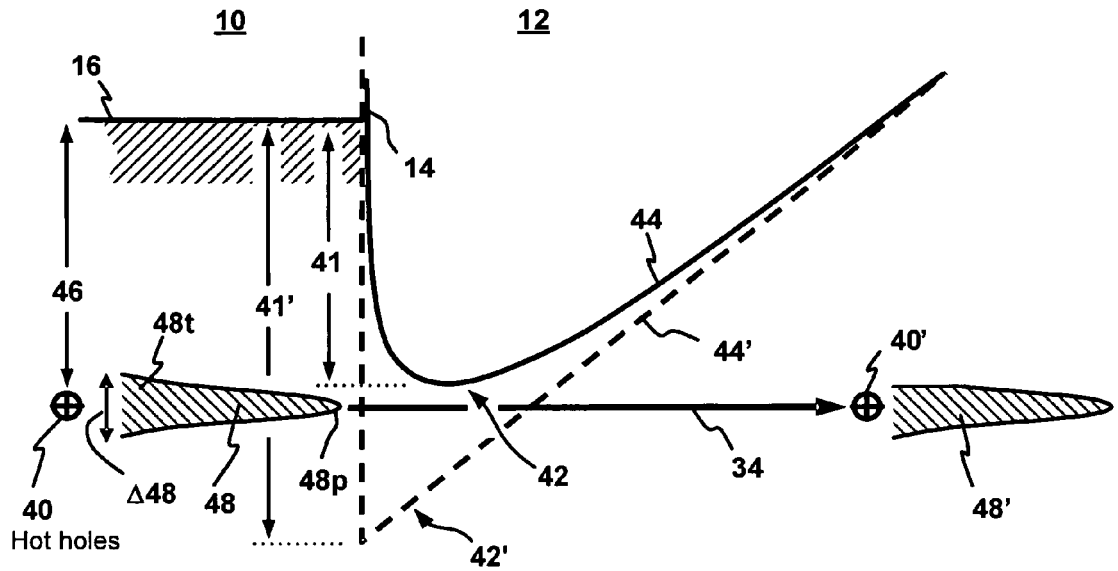
FIG. 2 is an energy band diagram showing hot holes having narrow energy spectrum transporting through potential barrier in the valence band of the conductor-insulator system.

FIG. 2 presents an energy band diagram for holes as an example for illustration. In FIG. 2, the conductor-insulator system comprises a conductor 10 having energized charge carriers 40 with an energy distribution 48 and an insulator 12 contacting the conductor 10 at an interface 14 and having an Image-Force potential barrier 42 adjacent to the interface 14, wherein the Image-Force potential barrier 42 is electrically alterable to permit the energized charge carriers 40 transporting there over.

The diagram of FIG. 2 is in all respects the same as that of FIG. 1A except few differences. One of the differences is that instead of providing hot electrons 37 as the transporting charge carriers, the diagram is provided with energized holes 40 (or "hot holes" 40). Additionally, barriers formed by the insulator are now in connection with valence band of the insulator. Also shown are a barrier height 41' of a potential barrier 42' in connection with a valence band 44' for case without the Image-Force effect, and a barrier height 41 of an Image-Force barrier 42 at valence band 44 of the conductor-insulator system of FIG. 1A. The barrier height 41 is lowered by the Image-Force barrier lowering effect in similar way as described for barrier height 20 in connection with FIGS. 1A and 1B while an electric field is applied to insulator.

In FIG. 2, hot holes 40 are shown having an energy distribution 48 on population distributed in a Gaussian-shape profile having a narrow energy spectrum Δ48. The distribution 48 is shown having a peak distribution 48p and a tail distribution 48t. The holes at the peak distribution 48p are shown having a kinetic energy 46 with respect to the Fermi-level 16 of the conductor. The kinetic energy 46 is shown slightly higher than the Image-Force barrier height 41 and lower than the barrier height 41'. Without the Image-Force barrier lowering effect, holes 40 having the distribution 48 are shown having their energy below barrier height 41' and thus are unable to surmount the barrier 42'. However, with the Image-Force effect, holes 40 are shown having a majority portion (except the tail portion 48t) being able to surmount the Image-Force barrier 42, transporting along the forward direction 34 to become holes 40' having an energy distribution 48' on their population. Such holes 40' have energy higher than the valence band 44 and can continue transporting within the insulator along the same direction to reach material adjacent to the other side of the insulator (not shown). The holes 40 within the tail distribution 48t are shown having kinetic energy slightly below the barrier height 41. Such holes are blocked from surmounting Image-Force barrier 42 and are not included in the distribution 48'. However, due to the tight energy spectrum Δ48 of holes 40, situation on blocking holes 40 within the tail distribution 48t can be easily avoided by lifting energy of such holes through applying an additional small voltage (e.g. about 100 mV). The example described here illustrates an advantage on transporting energized charge carriers having tight energy distribution in the conductor-insulator system of the present invention.

It is now clear that with the Image-Force barrier lowering effect employed in the conductor-insulator system of the present invention, hot carriers (electrons or holes) can be transported through insulator barrier at lower kinetic energy, and the operation voltage can be lowered when employing such effect for operating memory cell or semiconductor devices. To achieve high injection efficiency, it is desirable that carriers having tight energy spectrum on energy distribution are provided as the hot carriers and are used along with the Image-Force barrier lowering effect for memory cell operations.

It is to be understood that the present invention is not limited to the illustrated herein and embodiments described above, but encompasses any and all variations falling within the scope of the appended claims. For example, although the carriers distributions 38 and 48 of the present invention is illustrated in Gaussian shape, it should be apparent to those having ordinary skill in the art that the distribution can be extended to any other type of shapes and spectrums, and the shape need not be symmetrical in the energy.

The conductor of the conductor-insulator system can be a semiconductor, such as n+ polycrystalline Silicon ("polysilicon"), p+ polysilicon, heavily-doped polycrystalline Silicon-Germanium ("poly-SiGe"), or a metal, such as aluminum (Al), platinum (Pt), Au, Tungsten (W), Molybdenum (Mo), ruthenium (Ru), tantalum (Ta), nickel (Ni), tantalum nitride (TaN), titanium nitride (TiN) etc, or alloy thereof, such as platinum-silicide, tungsten-silicide, nickel-silicide etc. The insulator can be a dielectric or air. When dielectric is considered as the insulator, material such as oxide, nitride, oxynitride ("SiON") can be used for the dielectric. Additionally, dielectrics having dielectric constant (or permittivity) k lower or higher than that of oxide ("Low-k dielectrics" or "High-k dielectrics", respectively) can also be considered as the material for the insulator. Such Low-k dielectrics can be fluorinated silicon glass ("FSG"), SiLK, porous oxide, such as nano-porous carbon-doped oxide ("CDO") etc. Such High-k dielectrics can be aluminum oxide ("$Al_2O_3$"), hafnium oxide ("$HfO_2$"), titanium oxide ("$TiO_2$"), zirconium oxide ("$ZrO_2$"), tantalum pen-oxide ("$Ta_2O_5$") etc. Furthermore, any composition of those materials and the alloys formed thereof, such as hafnium oxide-oxide alloy ("$HfO_2$—$SiO_2$"), hafnium-aluminum-oxide alloy ("HfAlO"), hafnium-oxynitride alloy ("HfSiON") etc. can be used for the dielectrics. Moreover, insulator need not be of dielectric materials having a uniform chemical element and need not comprising single layer, but rather can be dielectric materials having graded composition on its element, and can comprise more than one layer.

Figure 3:
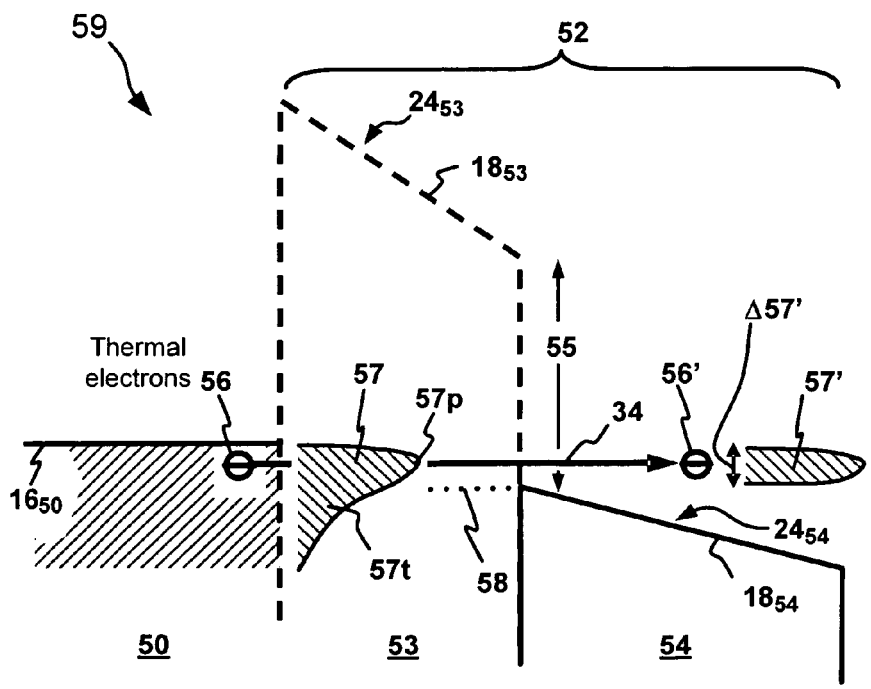
FIG. 3 is an energy band diagram for a conductor-filter system in accordance with the present invention.

FIG. 3 provides an energy band diagram for a conductor-filter system 59 in accordance with another embodiment of the present invention. In the conductor-filter system 59 of FIG. 3, there are shown a filter 52 contacting a conductor 50. The conductor 50 has thermal charge carriers of electrons 56. The filter 52 contacts the conductor 50 and includes dielectrics 53 and 54 for providing a filtering function on the charge carriers 56 of one polarity (negative charge carriers, electrons 56), wherein the filter 52 includes electrically alterable potential barriers $24_{53}$ and $24_{54}$ for controlling flow of the charge carriers 56 of one polarity through the filter 52 in one direction (forward direction 34).

FIG. 3 is an example of the filtering function. The conductor 50 has Fermi-level energy $16_{50}$ and can be a semiconductor, such as n+ polysilicon, p+ polysilicon, heavily-doped polycrystalline Silicon-Germanium ("poly-SiGe"), or a metal, such as aluminum (Al), platinum (Pt), Au, Tungsten (W), Molybdenum (Mo), ruthenium (Ru), tantalum (Ta), nickel (Ni), tantalum nitride (TaN), titanium nitride (TiN) etc, or alloy thereof, such as platinum-silicide, tungsten-silicide, nickel-silicide etc. The filter 52 is shown comprising a tunneling dielectric TD 53 and a blocking dielectric BD 54. The tunneling dielectric TD 53 is shown having a barrier $24_{53}$ formed in the conduction band $18_{53}$ of TD 53. The blocking dielectric BD 54 is shown having a barrier $24_{54}$ formed in the conduction band $18_{54}$ of BD 54 and the conduction band $18_{54}$ is shown having an offset 55 with the conduction band $18_{53}$ of TD 53. TD 53 is disposed adjacent to the conductor 50, and BD 54 is disposed adjacent to TD 53. Typically, BD 54 has an energy band gap narrower than that of TD 53. The filter 52 can have different band bending on conduction bands as a voltage is applied across the filter. The conduction band $18_{54}$ of BD 54 is shown having a less band bending than that shown for conduction band $18_{53}$ of TD 53. The conductor 50 supplies thermal electrons 56 having an energy distribution 57 on population. The energy distribution 57 of electrons 56 is shown below Fermi-level energy $16_{50}$ and has a peak distribution 57p and a tail distribution 57t in its distribution profile. The conductor 50 provides charge carriers having energy at or lower than Fermi-level energy, and hence functions somewhat like a "low-pass" carrier provider. With electric fields applied in the filter 52, electrons 56 in the peak portion distribution 57p are shown being able to transport through TD 53 in quantum mechanical tunneling mechanism (e.g. direct tunneling) through the barrier $24_{53}$ of TD 53, and can enter the conduction band $18_{54}$ of BD 54 to become energized electrons 56' having a tight energy spectrum Δ57' on energy distribution 57'. In a contrast, the electrons 56 within the tail distribution 57t are shown unable to tunnel through barriers $24_{53}$ and $24_{54}$. The barrier $24_{54}$ of BD 54 provided in the filter 52 forms an additional tunneling barrier for the electrons 56 within the tail distribution 57t and a blocking effect on these electrons takes place and is made by keeping barrier $24_{54}$ at an energy level ("threshold energy" 58) higher than the energy of these electrons. The threshold energy 58 is to first order established by both barriers $24_{53}$ and $24_{54}$ (it's controlled by a voltage drop in barrier $24_{53}$ and the offset 55 between barriers $24_{53}$ and $24_{54}$). The blocking effect of barrier structure of filter 52 thus provides a filtering mechanism producing a high-pass filtering effect on tunneling charge carriers 56. This filtering effect is unique and is somewhat different than the filtering effect on energized carriers (e.g. hot electrons 32) described in connection with FIG. 1A. While TD 53 and BD 54 are shown in the filter 52 of FIG. 3, such showing is only by way of example and any additional layers having potential barriers suitable for controlling carrier flow can be employed. Such layers can be a semiconductor or a dielectric and can be disposed in between TD 53 and BD 54 or can be disposed adjacent to only one of them.

The unique portion of the conductor-filter system of FIG. 3 lies on its capability of providing charge carriers transporting in tight energy distribution. Such capability is a result of the "low-pass" carrier provider function of the conductor 50 and the high-pass filter function of the filter 52. Combing both such functions, the conductor-filter system of FIG. 3 provides a "band-pass" filtering function that permits charge carriers having narrow energy spectrum in their distribution be transported. The band-pass filtering function is one embodiment of the filtering function of filter 52, and permits the conductor-filter system functioning as a "band-pass filter" having a "bandwidth" controlled by the Fermi-level energy 16$_{50}$ and the threshold energy 58. Typically, the energy spectrum is in the range from about 30 meV to about 900 meV, and is preferably in the range from about 30 meV to about 300 meV.

The filter 52 provides filtering effect on passing electrons having energy higher than the threshold energy 58. This results in passing electrons in the peak distribution 57$p$ and blocking electrons in the tail distribution 57$t$. The energy distribution 57' of electrons 56' is shown as an example illustrating the "band-pass" filtering function of the conductor-filter system of FIG. 3, and the distribution 57' is shown similar to the peak distribution 5'7$p$ of the distribution 57 to illustrate this effect. For best "band-pass" filtering effect, the energy spectrum Δ57' of distribution 57' typically can be narrowed or widen by adjusting the threshold energy 58 at a higher or a lower level, respectively, than level shown in FIG. 3. Ability on adjusting energy spectrum Δ57' is desirable as it permits a modulation on "bandwidth" of the band-pass filter for filtering effect in any practical application. This can be done by adjusting the voltage applied across filter 52 or by adjusting other parameters to be described in following paragraphs.

In constructing the filter 52 of FIG. 3, BD 54 having a larger dielectric constant relative to that of TD 53 is usually desirable for following considerations. First, it reduces the electric field in BD 54, which can reduce the tunneling probability of electrons in the tail distribution 57$t$, and hence can enhance the blocking effect on these electrons. Furthermore, when applying a voltage across the filter 52 for the filtering effect, the larger dielectric constant for BD 54 permits a larger portion of the applied voltage appearing across TD 53. This enhances voltage conversion between applied voltage and voltage across TD, thus has advantages on lowering the applied voltage required for the filtering effect, increasing sensitivity of the applied voltage on the filtering effect, and increasing blocking range in energy spectrum for electrons distributed in the tail distribution.

Additionally, other parameters can also be considered in constructing the filter 52 of FIG. 3 for adjusting the energy spectrum Δ57'. One such parameter is the conduction band offset 55 between BD and TD. The conduction band offset 55 can be tailored at different values to control the threshold energy 58 beyond which electrons 56 in the distribution 57 are permitted to tunnel through the filter 52. This can be done by properly choosing materials for BD 54 and for TD 53. In a specific example, when choosing oxide as the material for TD 53, a dielectric film of oxynitride system ("SiO$_x$N$_{1-x}$") will be a good candidate for BD 54 because of its well-proven manufacturing-worthy film quality and process control. In SiO$_x$N$_{1-x}$, the "x" is the fractional oxide or the equivalent percentage of oxide in the oxynitride film. For example, x=1 is for case where the film is a pure oxide; similarly x=0 is for case where the film is a pure nitride. As the fractional oxide x is changed from 0 to 1, the conduction band offset 55 can be changed from about 1 eV to 0 eV. Thus, a tailoring on the fractional oxide x in SiO$_x$N$_{1-x}$ permits a tailoring on the conduction band offset 55 to a desired range for filter 52, and hence provides method on adjusting the energy spectrum Δ57' (i.e. the "bandwidth" of the band-pass filter) to range desired for use in practical applications.

Figure 4:
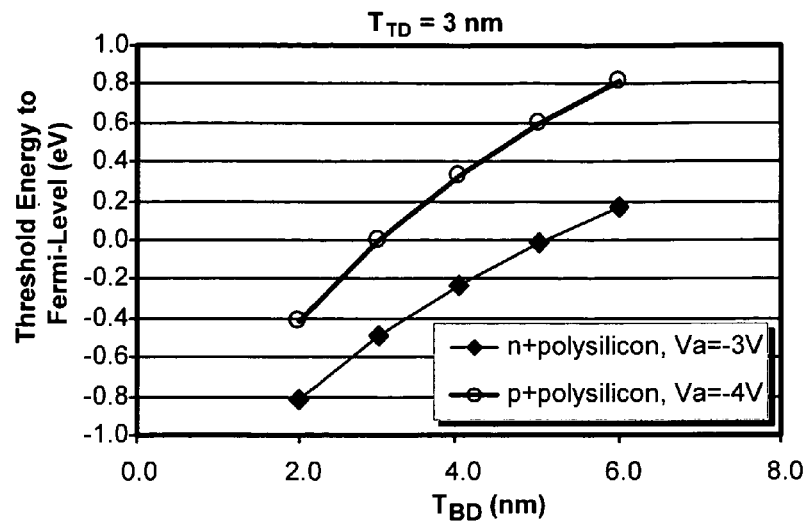
FIG. 4 shows relative energy level of threshold energy to Fermi-level with the applied voltage Va as the plotting parameter.

Other parameters such as thicknesses of TD 53 and BD 54 and Fermi-level energy 16$_{50}$ of conductor 50 can also be used to provide method adjusting the threshold energy level 58, and its level relative to the Fermi-level energy 16$_{50}$, and hence the "band-width" of the band-pass filter. These parameters are considered herein in constructing the conductor-filter system of FIG. 3. For illustration purpose, polysilicon, oxide, and nitride are assumed as the materials for conductor 50, TD 53, and BD 54, respectively, of the conductor-filter system of FIG. 3. The oxide of TD is assumed having a thickness of 3 nm. FIG. 4 shows the relative energy level of the threshold energy 58 to the Fermi-level 16$_{50}$ for two cases illustrated here. The range where threshold energy to Fermi-level is in negative value corresponds to situation where threshold energy is at level lower than the Fermi-level, and the difference between them to first order corresponds to the "band-width" of the band-pass filter. The two cases have differences on Fermi-level of the polysilicon (n+ vs. p+ polysilicon) and on applied voltage Va across the filter 52. The applied voltage Va can determine the kinetic energy of electrons 56' after tunneling through the filter. Referring to FIG. 4, for the case with p+ polysilicon and Va=−4V, the range where threshold energy is under the Fermi-level ranges from 0 eV to about 0.4 eV as reducing a thickness of BD ("T$_{BD}$") from about 3 nm to about 2 nm. For the case with n+ polysilicon and Va=−3V, a wider range (about 0.8 eV) for threshold energy under the Fermi-level is shown for T$_{BD}$ within the range of 5 nm to 2 nm.

It should now be clear that the threshold energy relative to Fermi-level of conductor can be adjusted by method adjusting thicknesses of TD and BD in the filter and/or by adjusting Fermi-level of conductor. Such method can be used to tailor the band-width of the transporting charge to a desired range for a practical application. The kinetic energy of transporting charge carriers can be controlled and targeted to an application by employing this method.

The conductor-filter system of FIG. 3 can be used to provide band-pass filter function for other type of charge carriers, such as holes (e.g. light-holes ("LH") or heavy holes ("HH")). Similar considerations as described in connection with FIGS. 3 and 4 for electrons can be readily applied to these holes by considering the tunneling barriers of filter 52 formed in the valence band of energy band diagram. Due to the opposite charge polarity of holes to electrons, band-pass filtering holes can be done by reversing the voltage polarity across filter 52 from the one shown in FIG. 3.

It should also be clear to those of ordinary skill in the art that the teachings of this disclosure can be applied to modify the dielectrics of filter through which the filtered charge distribution can be tailored for the filtering effect. For example, although the dielectric constant of BD 54 is illustrated to be greater than that of TD 53, it should be clear that the teaching of this disclosure can be applied to modify the BD 54 to material having dielectric constant similar to that of TD 53 to effectively pass charge carriers in peak distribution during tunneling transport. Additionally, the quantum mechanisms in this disclosure need not be direct tunneling, but rather can be any other types of mechanism such as Frenkel-Poole emission that effectively transports thermal charge carriers from the conductor through the filter. Furthermore, TD 53 and BD 54 need not be of materials having a uniform chemical element but can be materials having graded composition on its element. In addition, any appropriate dielectric, such as aluminum oxide ("Al$_2$O$_3$"), hafnium oxide ("HfO$_2$"), titanium oxide ("TiO$_2$"), zirconium oxide ("ZrO$_2$"), tantalum pen-oxide ("Ta$_2$O$_5$") etc. can be used in place of oxide, nitride, or oxynitride. Furthermore, any composition of those materials and the alloys formed thereof, such as hafnium oxide-oxide alloy ("HfO$_2$—SiO$_2$"), hafnium-aluminum-oxide alloy ("HfAlO"), hafnium-oxynitride alloy ("HfSiON") etc. can be used in place of oxide, nitride, or oxynitride.

Figure 5:
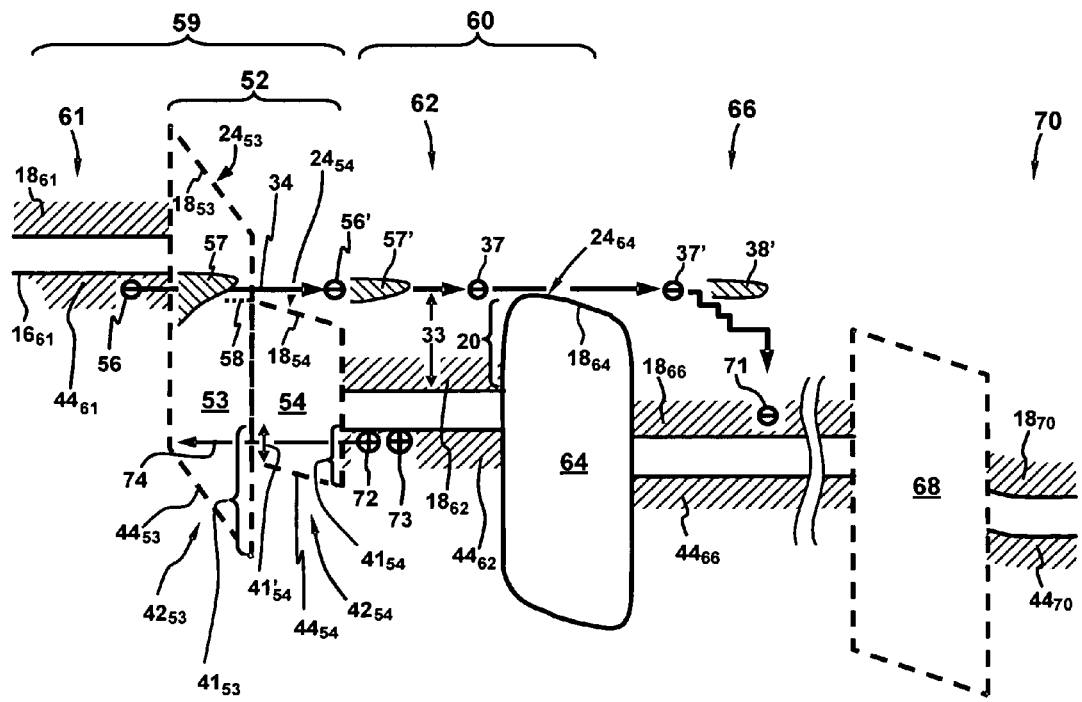
FIG. 5 is an energy band diagram in accordance with one embodiment on charge-injection system of the present invention illustrating the filtering and the image-force barrier lowering for ballistic-electrons-injection mechanism.

FIG. 5 provides an energy band diagram of a charge-injection system on injecting electrons having tight energy distribution. Referring to FIG. 5, there is shown a conductor-filter system 59 of the type described in connection with FIG. 3, a conductor-insulator system 60 of the type described in connection with FIG. 1A, a charge storage region ("CSR") 66, an insulator such as a channel dielectric ("CD") 68, and a semiconductor region such as a body 70. The energy band structure of FIG. 5 is shown with its full band structure. For example, in the conductor-filter system 59, there are also shown valence bands $44_{53}$ and $44_{54}$ in addition to the conduction bands $18_{53}$ and $18_{54}$ of FIG. 3. The conductor-filter system 59 comprises a tunneling-gate ("TG") 61 and a charge filter 52 as the conductor and the filter of the system, respectively. The filter 52 includes potential barriers $24_{53}$ and $24_{54}$, and has a threshold energy 58 established by the barriers for controlling its filtering effect as described in connection with FIG. 3. The filter 52 further comprises the tunneling dielectric ("TD") 53 and the blocking dielectric ("BD") 54 as described in connection with FIG. 3. The conductor-insulator system 60 comprises a ballistic gate ("BG") 62 and a retention dielectric ("RD") 64 as the conductor and the insulator of the system, respectively. The energy band diagram of the charge-injection system in regions from TG 61 to RD 64 is constructed by "contacting" the filter 52 of the conductor-filter system 59 to the conductor (BG 62) of the conductor-insulator system 60. TG 61 and BG 62 are semiconductors having conduction band $18_{61}$ and valence band $44_{61}$, and conduction band $18_{62}$ and valence band $44_{62}$ for TG 61 and BG 62, respectively. TG 61 is shown of a p-type semiconductor having thermal electrons 56 in the valence band $44_{61}$ as the supplied carriers. CSR 66 is shown insulated from BG 62 and body 70 by dielectrics RD 64 and CD 68, respectively, and comprises semiconductor having a conduction band $18_{66}$ and a valence band $44_{66}$ and of n-type conductivity. CSR 66 may comprise semiconductor of other type of conductivity (e.g. p-type), and may comprise metal or any other suitable material (e.g. nanoparticles or traps in dielectrics) that can effectively store charge carriers. Body 70 comprises semiconductor having conduction bands $18_{70}$, and valence band $44_{70}$, respectively, and can be used to modulate an Image-Force barrier $24_{64}$ of the conductor-Insulator system 60 by coupling voltage into CSR 66 through adjacent dielectric such as CD 68. Dielectrics RD 64 and CD 68 are shown in single layer and can generally comprise more than one layer to form a composite layer.

In the conductor-filter system 59 of FIG. 5, the conductor 61 has thermal charge carriers 56. The filter 52 contacts the conductor 61 and includes dielectrics 53 and 54 for providing a filtering function on the charge carriers 56 of one polarity (negative charge carriers), wherein the filter includes a first set of electrically alterable potential barriers $24_{53}$ and $24_{54}$ for controlling flow of the charge carriers 56 of one polarity through the filter 52 in one direction (forward direction 34). In addition to controlling the one polarity of charge carriers (negative charge carriers, electrons 56), the filter 52 further includes a second set of electrically alterable potential barriers $42_{53}$ and $42_{54}$ for controlling the flow of charge carriers of an opposite polarity (positive charge carriers, LH 72 and HH 73) through the filter in another direction (backward direction 74) that is substantially opposite to the one direction.

Such filtering function permits charge carriers of one polarity type transporting along the forward direction 34 (i.e. from TG 61 to BG 62) and blocks charge carriers of an opposite polarity type transporting along a backward direction 74 (i.e. from BG 62 to TG 61). Thus, the filter 52 provides a charge-filtering function that can "purify" the charge flow. The charge-filtering function is another embodiment of the filtering function of filter 52.

FIG. 5 further provides illustration on process forming and injecting charges having tight energy distribution. There are shown thermal electrons 56 having an energy distribution 57 on population be supplied by TG 61 as supplied carriers. These electrons 56 are filtered by filter 52 during their transport through the filter 52 via mechanisms such as direct tunneling and Frenkel-Poole emission described in connection with FIG. 3. After filtered, thermal electrons become energized electrons 56' having energy higher than the conduction band $18_{54}$ and having a tighter energy distribution 57' than the distribution 57 before filtered. Such electrons 56' are fed to the conductor-insulator system 60. In one case, a portion of the electrons 56' can transport through BG 62 without scattering ("ballistic transport") at a kinetic energy 33 higher than the conduction band $18_{62}$ of BG 62 to become energized electrons 37 at the interface of BG 62 and RD 64. Such electrons 37 do not experience scattering with other particles (e.g. electrons, phonons etc.), and hence can conserve their kinetic directional energy and momentum along original movement. In another case, electrons 56' can transport through BG 62 in partial scattering ("partially ballistic transport") with other particles and can still maintain their kinetic energy 33 high enough and directional toward the interface of BG 62 and RD 64 to become electrons 37. In all cases, such energized electrons 37 (termed "ballistic electrons") can surmount a barrier height 20 of the Image-Force barrier $24_{64}$ in mechanism as described in connection with FIGS. 1A and 1B, entering a conduction band $18_{64}$ of RD 64, making their way there through to become electrons 37' having an energy distribution 38' on their population, and finally got collected and stored on CSR 66 as electrons 71 in the conduction band $18_{66}$. Such process in forming and injecting charges (either in the ballistic transport or in the partially ballistic transport) is termed as ballistic-charge injection mechanism. When electrons are selected as the charge carriers, such mechanism is termed as ballistic-electron injection mechanism. Typically, the energy distribution of the energized charge carriers (electrons 37) has an energy spectrum in the range of about 30 meV to about 300 meV. The injection efficiency (defined as the ratio of number of carriers collected to the number of carriers supplied) of such electrons typically ranges from about $10^{-4}$ to about $10^{-1}$.

The ballistic-charge injection shown in FIG. 5 illustrates the ballistic-electron injection and is done by applying a voltage between TG 61 and BG 62 such that electrons 37 have a kinetic energy 33 higher than the Image-Force barrier height 20 of the conductor-insulator system 60. Such voltage can be lowered by lowering barrier height 20 of the Image-Force barrier $24_{64}$ by using means as described in connection with FIGS. 1A and 1B. This can be done by for example coupling a positive voltage (e.g. from about +1 V to about +3 V) to CSR 66. Alternately, the barrier height 20 can be lowered by choosing material for CSR 66 having a smaller work-function (or a higher Fermi-level energy) than that of BG 62.

For the example shown in FIG. 5, when applying voltage having polarity to inject electrons 56 in TG 61 along the forward direction 34, it simultaneously induces holes LH 72 and HH 73 in BG 62 to transport along the backward direction 74. The backward transporting LH 72 and HH 73 can result in undesired problems. For example, it can trigger impact-ionization in TG 61 when they got backward transported into that region due to their higher energy than the valence band $44_{61}$. Further, these holes do not contribute to memory operation when employing the ballistic-electron-injection for a program operation of a memory cell. Therefore, it can waste electrical current and hence power. It is thus desirable to block LH 72 and HH 73 from backward transporting into TG 61.

The energy band structure in FIG. 5 shows the backward-transporting carriers (i.e. LH 72 and HH 73) has to transport through more barriers in the filter 52 than the forward-transporting carriers (i.e. electrons 56) do, and hence the filter provides charge-filtering effect on blocking the backward-transporting carriers. The filtering effect is based on the energy band structure constructed by potential barriers in filter 52. A first potential barrier $42_{54}$ blocking the backward transporting holes 72 and 73 comprises barrier heights $41_{54}$ and $41'_{54}$ at an entrance side and at an exit side of barrier $42_{54}$, respectively. Both barrier heights $41_{54}$ and $41'_{54}$ are referenced to valence band $44_{54}$ of BD 54. A second potential barrier $42_{53}$ having a barrier height $41_{53}$ at its entrance side forms another barrier blocking holes 72 and 73. The barrier height $41_{53}$ is referenced to valence band $44_{53}$ of TD 53 at the interface between TD 53 and BD 54.

Typically, the charge-filtering function is maximized by choosing materials for TD 53 and BD 54 such that a product of the dielectric constant of BD 54 and the thickness of TD 53 is substantially greater than a product of the dielectric constant of TD 53 and the thickness of BD 54.

One specific embodiment on the conductor-filter and conductor-insulator systems 59 and 60 that is used for the charge-injection system comprises a p+ polysilicon for TG 61, an oxide layer for TD 53, a nitride layer for BD 54, an n+ polysilicon for BG 62, and an oxide layer for RD 64. The n+ polysilicon is considered for BG 62 due to several considerations. A major consideration lies in the much higher solid solubility for n-type impurities (e.g. Arsenic, phosphorous etc) than that for p-type impurities (e.g. Boron). Impurity with a higher solid solubility is desirable as it usually can dope the silicon heavier to result in a lower sheet resistance, and is favorable for integrated circuits (IC) application. In the embodiment, polysilicon is employed as the material for TG 61 and BG 62 due to its well proven yield, manufacturability, and compatibility with state of the art IC technology. An oxide with a thickness of about 7 nm to 10 nm is employed for RD 64 due to the same reason. The oxide layer used for TD 53 can be with a thickness in the range of about 1.5 nm to 4 nm and preferably in the range of about 2 nm to 3.5 nm. The thickness of TD 53 layer is chosen in the range where charge-carriers (electrons, LH or HH) transporting across the layer are primarily through the direct tunneling mechanism. The thickness of BD 54 is chosen to block any type of charge-carriers from tunneling transport through both BD 54 and TD 53 layers when a modest voltage in the range of about 1 V to about 2.5V is applied between TG 61 and BG 62. The thickness of BD 54 is further chosen to permit one type of charge carriers (e.g. electrons) transporting in the forward direction and to block the other type of charge carriers (e.g. LH) from transporting in the backward direction when in a higher voltage range (3V or higher). The selection on thickness of BD 54 is also determined by it dielectric constant. In general, the thickness of BD 54 can be thinner or thicker than that of TD 53 provided filter 52 can effectively meet the forgoing requirements. For example, in the specific embodiment here, if an oxide with 3 nm (or 30 Å) is chosen for TD 53, then the minimum thickness for BD 54 can be about 2 nm (or 20 Å) or thicker. For the specific embodiment, the nitride for BD 54 can be a high quality nitride without charge trapping centers in its band gap. This high quality nitride can be formed in $NH_3$ (ammonia) ambient at a high temperature (e.g. in range from 900° C. to 1100° C.) by using, for example, RTN (Rapid Thermal Nitridation) technique well-known in the art. The oxide for TD 53 can be a HTO (high temperature oxide) or a TEOS layer formed by using conventional CVD deposition techniques such as LPCVD, RTCVD and the like. Alternately, TD 53 can be a thermal oxide formed by oxidizing the nitride of BD 54 at a high temperature (e.g. in range from 900° C. to 1000° C.) by using thermal oxidation technique well-known in the art. Such technique provides a conversion process converting a portion of the nitride of BD 54 to a layer of oxide for the TD 53 with a transition layer of oxynitride formed there between. Typically, the oxynitride layer has a thickness in the range of about 0.5 nm to about 2 nm. It should be noted that during such nitride-to-oxide conversion process, a loss on nitride thickness has an effect on the final thickness for BD 54. Therefore, to meet the desired thicknesses for BD 54 and TD 53 of the specific embodiment, a thicker nitride, such as 3.5 nm, need be considered in step prior to the oxidation to compensate the nitride loss during the oxidation.

While oxide and nitride are shown as the materials for TD 53 and BD 54, respectively, in the specific embodiment, such showing is only by way of example and any other types of dielectric materials and their combination can be readily employed for TD and BD. For example, in another embodiment, TD 53 can comprises oxide having a thickness in a range of about 1.5 nm to about 4 nm and BD 54 can comprises material selected from the group consisting of nitride, oxynitride, $Al_2O_3$, $HfO_2$, $TiO_2$, $ZrO_2$, $Ta_2O_5$, and alloys formed thereof. In still another embodiment, TD 53 can comprises oxynitride having a thickness in a range of about 1.5 nm to about 4 nm and BD 54 can comprises material selected from the group consisting of nitride, $Al_2O_3$, $HfO_2$, $TiO_2$, $ZrO_2$, $Ta_2O_5$, and alloys formed thereof.

The forgoing illustration on the ballistic-charge-injection is made on electrons. Similar illustration can be readily made for light-holes and heavy-holes to achieve similar effects on charge filtering and injection.

Figure 6:
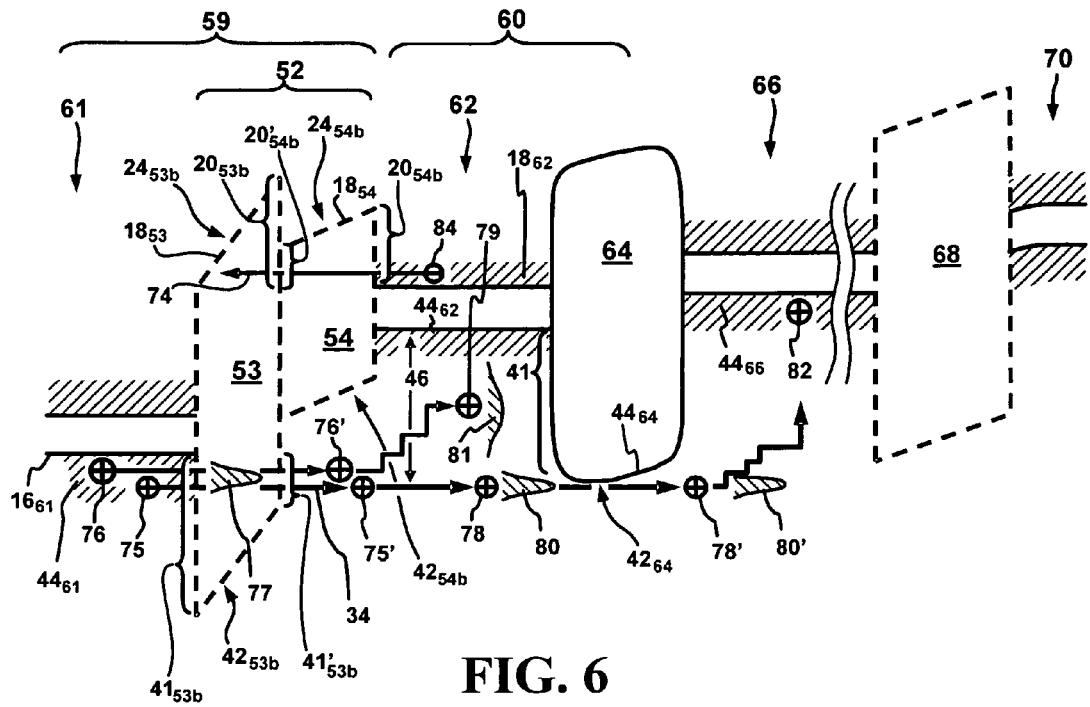
FIG. 6 is an energy band diagram in accordance with another embodiment of the present invention illustrating the charge-filtering and the image-force barrier lowering for ballistic-light-holes-injection mechanism.

FIG. 6 provides an energy band diagram to illustrate the ballistic-charge-injection and filtering effect for holes in the charge-injection system of the FIG. 5 type. In the conductor-filter system 59 of FIG. 6, the conductor, TG 61, supplies thermal charge carriers 75 and 76. The filter 52 contacts the conductor, TG 61, and includes dielectrics 53 and 54 for providing a filtering function on the charge carriers 75 and 76 of one polarity (positive charge carriers), wherein the filter includes electrically alterable potential barriers $42_{53b}$ and $42_{54b}$ for controlling flow of the charge carriers 75 and 76 of one polarity through the filter 52 in one direction (forward direction 34). In addition to controlling the one polarity of charge carriers (positive charge carriers 75 and 76), the filter 52 further includes electrically alterable potential barriers $24_{53b}$ and $24_{54b}$ for controlling the flow of charge carriers of an opposite polarity (negative charge carriers, electrons 84) through the filter in another direction (backward direction 74) that is substantially opposite to the one direction.

Such filtering function permits charge carriers of one polarity type transporting along the forward direction 34 and blocks charge carriers of an opposite polarity type transporting along a backward direction 74. Thus, the filter 52 provides a charge-filtering function that can "purify" the charge flow. The charge-filtering function is another embodiment of the filtering function of filter 52, and is similar to the charge-filtering function as described in connection with FIG. 5.

Referring to FIG. 6, there is shown LH 75 and HH 76 in the valence band $44_{61}$ of TG 61 as the supplied carriers for injection. LH 75 and HH 76 are shown transporting along the forward direction 34 in an energy distribution 77 on their population. Although energy distribution for LH 75 and HH 76 are shown in same distribution 77, it is noted that LH 75 and HH 76 can have different energy distributions on their population due to differences on their effective masses.

In FIG. 6, both LH 75 and HH 76 are shown transporting through barriers of filter 52 in quantum mechanical tunneling mechanism to become LH 75' and HH 76' having a kinetic energy 46 with respect to the valence band $44_{62}$ of BG 62 that is slightly higher than a barrier height 41 of an Image-Force barrier $42_{64}$. When these carriers transport further along the forward direction, their transport behaviors through BG 62 are very different due to their difference on effective mass. For HH 76', due to their heavy effective mass, the mean-free-path can be very short. Therefore, HH 76' are prone to experience scattering events with other particles (e.g. phonons), and have low ballistic transport efficiency ("ballisticity"). In FIG. 6, HH 76' are shown experiencing scattering events and losing their energy to become HH 79. Further, these scattered HH 79 are shown having a broad energy distribution 81 than original one 77 due to scattering. Such holes 79 are shown transporting at energy below the barrier height 41 of Image-Force barrier $42_{64}$ at the valence band $44_{64}$ of RD 64, and hence are blocked from transporting over barrier $42_{64}$ and cannot enter CSR 66. In a contrast, the LH 75' has a lighter effective mass, and hence a much longer mean-free-path than that of HH 76' (for example, in silicon, the mean-free-path of LH is about 3 times of that of HH). In one case, a portion of these LH 75' can transport through BG 62, without scattering (i.e. in ballistic transport), at the kinetic energy 46 to become energized charge carriers LH 78 at the interface of BG 62 and RD 64. Such LH 78 do not experience scattering with other particles (e.g. phonons), and hence can conserve their kinetic directional energy and momentum along original movement and their energy distribution 80 similar to the original one 77. In another case, LH 75' can transport through BG 62 in the partial ballistic scattering, and still can maintain their kinetic energy 46 high enough and directional toward the interface of BG 62 and RD 64 to become LH 78. In all cases, such LH 78 (termed "ballistic light-hole" or "ballistic LH") can surmount the barrier height 41 of the Image-Force barrier $42_{64}$ in mechanism as described in connection with FIG. 2, entering a valence band $44_{64}$ of RD 64, making their way there through to become LH 78' having an energy distribution 80' on their population, and finally got collected and stored on CSR 66 as holes 82 in the valence band $44_{66}$. Such process in filtering and injecting hole charges (either in the ballistic transport or in the partially ballistic transport) is termed as ballistic-holes-injection mechanism. Typically, the energy distribution 80 of the energized charge carriers (LH 78) has an energy spectrum in the range of about 30 meV to about 300 meV. The injection efficiency (defined as the ratio of number of carriers collected to the number of carriers supplied) of such holes typically ranges from about $10^{-6}$ to about $10^{-3}$.

For the specific embodiment on materials for systems 59 and 60 as described in connection with FIG. 5, voltage of TG 61 is chosen in the range of about +5V to about +6.0V relative to voltage of BG 62 for the ballistic-holes-injection. Such voltage can be further lowered by lowering the Image-Force barrier height 41 of the conductor-insulator system 60 as described in connection with FIG. 2. This can be done by for example coupling a voltage in the range of about -1 V to about -3 V to CSR 66. Alternately, the Image-Force barrier height can be lowered by choosing material for CSR 66 having a larger work-function (or a lower Fermi-level energy) than that of BG 62. For example, p-type polysilicon has a lower Fermi-level energy than that of n-type silicon, and thus p-type polysilicon and n-type silicon are considered as one embodiment on materials for CSR 66 and BG 62, respectively.

The voltage applied between TG 61 and BG 62 can be further reduced by employing materials having similar Fermi-level energy for these regions. This constitutes another specific embodiment on materials for systems 59 and 60 for the ballistic-hole-injection. For example, the charge-injection system can comprise a p+ polysilicon for TG 61, an oxide layer for TD 53, a nitride layer for BD 54, a p+ polysilicon for BG 62, and an oxide layer for RD 64. Such embodiment allows voltage of TG 61 relative to voltage of BG 62 be chosen in a lower range (e.g. from about +4.5V to about +5.5 V) for the ballistic-holes-injection.

FIG. 6 further shows that electrons 84 in conduction band $18_{62}$ of BG 62 can transport along the backward direction 74 while biasing the energy band structure in the voltage polarity for transporting LH 75 and HH 76 along the forward direction 34. The backward transporting electrons 84 can result in undesired problems such as impact-ionization in TG 61, current and power waste etc. that are similar to those problems caused by backward transporting holes as described in connection with FIG. 5. It is thus desirable to block electrons 84 from backward transporting into TG 61 by using the filter 52.

The energy band structure in FIG. 6 shows the backward-transporting carriers (i.e. electrons 84) have to transport through more barriers than the forward-transporting carriers (i.e. LH 75 and HH 76) do. A first electron barrier $24_{54b}$ blocking the backward transporting electrons 84 comprises barrier heights $20_{54b}$ and $20'_{54b}$ at an entrance side and an exit side, respectively, of the barrier $24_{54b}$. Barrier heights $20_{54b}$ and $20'_{54b}$ are referenced to conduction band $18_{54}$ of BD 54 at interface between BD 54 and BG 62 and between TD 53 and BD 54, respectively. A second electron barrier $24_{53b}$ is shown having a barrier height $20_{53b}$ at its entrance side and forms another barrier blocking electrons 84. The barrier height $20_{53b}$ is referenced to conduction band $18_{53}$ of TD 53 at the interface between TD 53 and BD 54. A barrier height $20'_{53b}$ (not shown) exists at an exit side of barrier $24_{53b}$, and is referenced to conduction band $18_{53}$ of TD 53 at the interface between TG 61 and TD 53. In the example shown here, barrier height $20'_{53b}$ is below the energy level of electrons 84, and hence is not shown in FIG. 6. Both barriers $24_{54b}$ and $24_{53b}$ form an energy band structure in the conduction band of filter 52 to block backward-transporting electrons 84.

There are two similar barriers for holes 75 and 76 on their transporting path along the forward direction 34. A first potential barrier $42_{53b}$ is formed by TD 53 and has barrier heights $41_{53b}$ and $41'_{53b}$ at the entrance and the exit sides, respectively, of barrier $42_{53b}$. A second barrier $42_{54b}$ is formed by BD 54 and has barrier heights $41_{54b}$, and $41'_{54b}$ (not shown) at the entrance and the exit sides of barrier $42_{54b}$, respectively. Both the first and the second barriers $42_{53b}$ and $42_{54b}$ form energy band structure in the valence band of filter 52 and have effect on blocking the forward transporting holes 75 and 76. In FIG. 6, the energy band structure is biased to inject holes. Both barrier heights $41_{54b}$ and $41'_{54b}$ are below the energy level of forward transporting holes, and hence are not shown in FIG. 6.

The filter 52 further provides another filtering function in accordance with the present invention. Such filtering function permits charge carriers of one polarity type and having lighter mass (e.g. LH) to transport through the filter, and blocks charge carriers of the same polarity type and having a heavier mass (e.g. HH) from transporting there through. Thus, the filter 52 provides a mass-filtering function that can filter the charge carrier flows based on their mass.

Figure 7:
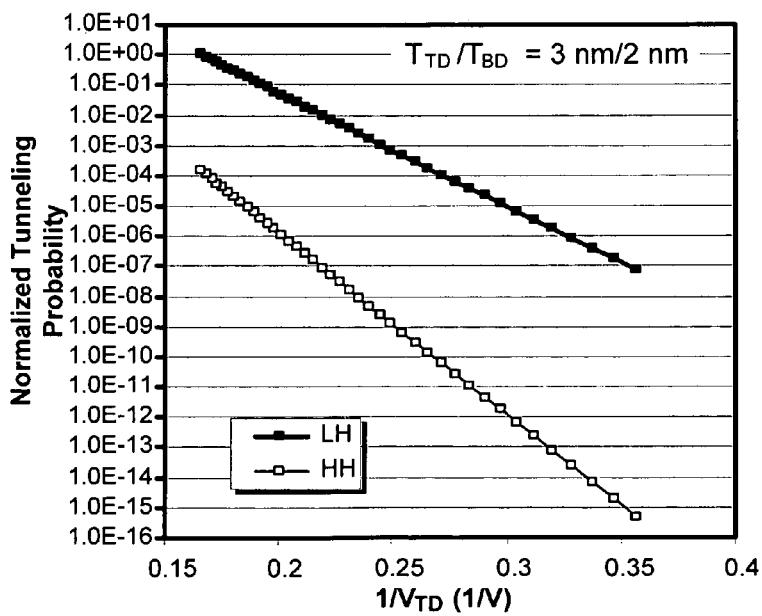
FIG. 7 shows normalized tunneling probability plotted as a function of reciprocal of voltage across TD for LH and HH.

FIG. 7 illustrates the basis of the mass-filtering function of the filter 52. The mass-filtering function can be better captured by referring back to FIG. 6. In the conductor-filter system 59 of FIG. 6, the conductor 61 supplies thermal charge carriers (LH 75 and HH 76). The filter 52 contacts the conductor 61 and includes dielectrics 53 and 54 for providing a filtering function on the charge carriers 75 and 76 of one polarity (positive charge carriers), wherein the filter includes electrically alterable potential barriers $42_{53b}$ and $42_{54b}$ for controlling flow of the charge carriers 75 and 76 of one polarity through the filter 52 in one direction (forward direction 34).

It is known in quantum mechanics theory that tunneling probability of charge carriers is a function of their mass, and the heavier carriers (e.g. HH 76) can have a tunneling probability lower than that of the lighter one (e.g. LH 75). FIG. 7 shows normalized tunneling probability calculated for LH and HH and is plotted as a function of the reciprocal of $V_{TD}$ to illustrate the mass-filtering function of filter 52. In the illustration, filter 52 is assumed comprising TD 53 of oxide having 3 nm on thickness and BD 54 of nitride having 2 nm on thickness. For the range of voltage (+5 V to +6 V) that is applied between TG 61 and BG 62 for ballistic-hole injection, the tunneling probability of HH is shown lower than that of LH by about 4 to about 8 orders of magnitude. The difference on tunneling probability due to the effect of carrier masses permits mass-filtering function realized in the filter 52. Although the illustration made herein is on hole carriers, the same illustration can be readily extended to other types of carriers having same polarity type but different mass. The mass-filtering function is another embodiment of the filtering function of filter 52.

The mass-filtering function of filter 52 and its application on passing LH brings desirable advantages to the present invention. For example, it can avoid wasting on the supplied carriers of TG 61 that are used for ballistic injection. This is because the majority population of the hole carriers in TG 61 are of the HH type, which has a shorter mean-free-path and prone to experience scattering events when transporting across BG 62. Such HH cannot efficiently contribute to the ballistic injection and thus are wasted when employed as the supplied carriers. By filtering out the HH through the mass-filter function of filter 52, the primary supplied carriers are now limited to LH carriers only. LH carriers have a longer mean-free-path and can more efficiently contribute to the ballistic injection while transporting through BG 62 via mechanism described in connection with FIG. 6. As a result, the mass-filtering function of filter 52 provides feature on selecting carriers having high ballisticity as the supplied carriers, and hence avoids waste on supplied current by carriers of low ballisticity.

The filter 52 of the conductor-filter system 59 provides unique filtering functions. It provides the band-pass filtering function as described in connection with FIG. 3, the charge-filtering function as described in connection with FIGS. 5 and 6, and the mass-filtering function as described in connection with FIG. 7. It should be clear to those of ordinary skill in the art that the teachings of this disclosure can be applied to modify the dielectrics and/or architecture of the filter through which these functions can be tailored individually or collectively. For example, the filter can contain more than two dielectrics to enhance its charge-filtering function. Further, the dielectrics of filter need not be having a uniform chemical element but rather can have a graded composition on its element that can effectively support these functions. Moreover, the dielectrics need not be in direct contact to each other but rather can have a transition layer, as described in connection with FIG. 5, disposed there between. It is thus understood that the present invention is not limited to the illustrated herein and embodiments described above, but encompasses any and all variations falling within the scope of the appended claims.

The Memory Cells of the Present Invention
Embodiment 100

Figure 8:
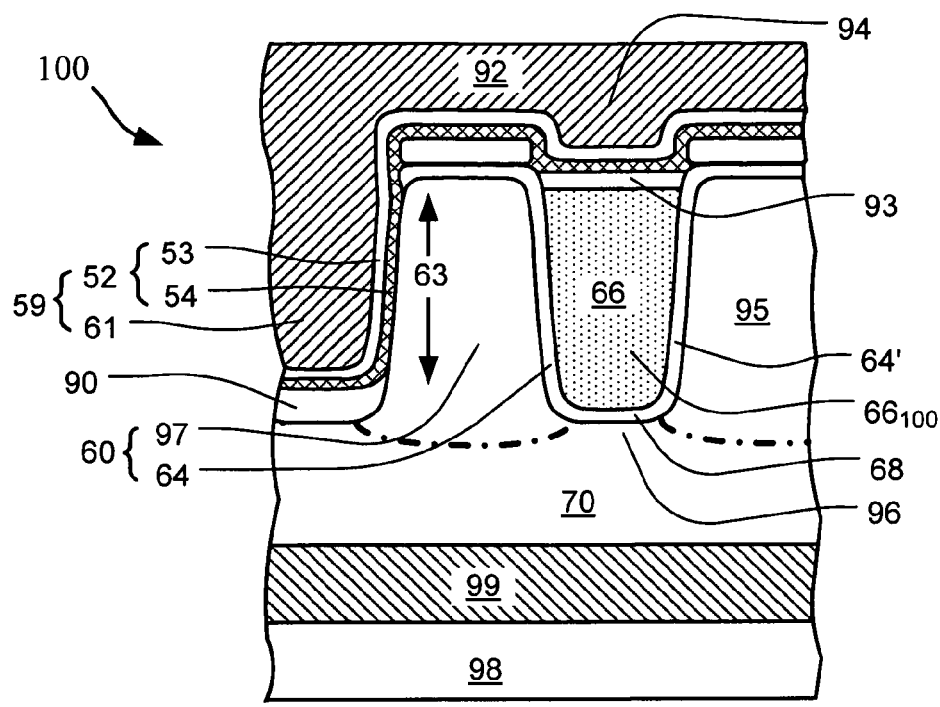
FIG. 8 is the cross sectional view of a cell structure in accordance with one embodiment of the present invention.

FIG. 8 shows a cross-sectional view of cell architecture 100 in accordance with one embodiment on cell structure of the present invention. Referring to cell 100 of FIG. 8, there is shown a body 70 of a semiconductor material having a first conductivity type, a conductor-filter system 59 of the type described in connection with FIGS. 3, 5 and 6 having a first conductor 61 and a filter 52, a conductor-insulator system 60 of the type described in connection with FIGS. 1A and 2 having a second conductor 97 and a first insulator 64. The cell 100 further comprises a source 95 spaced-apart from the second conductor 97 (drain 97) with a channel 96 of the body 70 defined there between, a second insulator 64' adjacent to the source 95, a charge storage region ("CSR") 66 in the form of a floating gate ("FG") $66_{100}$ disposed in between the first and the second insulators 64 and 64', and a word-line ("WL") 92 of a conductor. The body 70 is in or atop of a substrate 98 (such as a silicon substrate or a silicon-on-insulator substrate). An optional buried well 99 is provided in between the body 70 and the substrate 98 to isolate the body 70 from the substrate 98.

The WL 92 comprises a first portion 94 disposed over and insulated from the CSR 66 by a stack of coupling dielectrics including a floating-gate dielectric ("FD") 93, and a second portion 61 disposed over and insulated from the body 70 by a stack of dielectrics including a field oxide ("FOX") 90. The second portion 61 of WL 92 corresponds to the first conductor 61 of the conductor-filter system 59 for supplying charge carriers having tight energy distribution as described in connection with FIGS. 3, 5 and 6. Materials for WL 92 can be from the group comprising a semiconductor, such as n+ poly-silicon, p+ polysilicon, heavily-doped poly-SiGe etc, or a metal, such as aluminum (Al), platinum (Pt), Au, Tungsten (W), Molybdenum (Mo), ruthenium (Ru), tantalum (Ta), nickel (Ni), tantalum nitride (TaN), titanium nitride (TiN) etc, or alloy thereof, such as tungsten-silicide, nickel-silicide etc. While WL 92 in cell 100 is shown in a single layer, it may comprise more than one layer in architecture. For example, WL 92 can comprise a nickel-silicide layer formed atop of a polysilicon layer. Such structure forms a stack of conductive layers as one conductor for WL 92. The thickness of WL 92 can be in the range from about 80 nm to about 500 nm.

The conductor-filter system 59 of cell 100 comprises the first conductor 61 as a tunneling-gate ("TG") 61, and the filter 52, wherein TG 61 corresponds to the conductor of the system 59. The filter 52 provides the band-pass filtering function as described in connection with FIG. 3, the charge-filtering function as described in connection with FIGS. 5 and 6, and the mass-filtering function as described in connection with FIG. 7. In a preferred embodiment, the filter 52 comprises a tunneling dielectric ("TD") 53 and a blocking dielectric ("BD") 54 described in connection with FIG. 3.

The conductor-insulator system 60 comprises the drain 97 and a retention dielectric ("RD") 64 as the conductor 10 and insulator 12 of the system of FIG. 1A, respectively.

The cell structure in regions from TG 61 to RD 64 is constructed by "contacting" the filter 52 of the conductor-filter system 59 to the conductor (drain 97) of the conductor-insulator system 60. The TG 61 is disposed adjacent to and insulated from the drain 97 by the filter 52. The structure thus formed has TD 53 sandwiched in between the TG 61 and the BD 54, and has BD 54 sandwiched in between the TD 53 and the drain 97. The drain 97 is disposed adjacent to and insulated from the FG $66_{100}$ by the retention dielectric (RD 64). Likewise, the source 95 is disposed adjacent to and insulated from the FG $66_{100}$ by a source retention dielectric (SRD 64'). The TG 61 overlaps the drain 97 to form an overlap 63 between the two, where at least a portion of FG $66_{100}$ is disposed adjacent thereto. The overlap 63 is essential in the cell structure as supplied charge carriers of TG 61 are filtered through that portion of the filter 52 in order to be transported through drain 97, RD 64 and finally into the FG $66_{100}$. The FG $66_{100}$ is for collecting and storing such charge carriers and can be polysilicon, poly-SiGe or any other types of semiconductor materials that can effectively store charges. The conductivity of FG $66_{100}$ can be an n-type or a p-type. The FG $66_{100}$ is disposed adjacent to and insulated from the body 70 by a channel dielectric ("CD") 68. The FG $66_{100}$ is typically encapsulated and insulated by dielectrics such as RD 64, SRD 64', CD 68, or other dielectrics in close proximity having proper thickness and good insulation property to retain charges thereon without leaking. In a specific embodiment, material for RD 64, SRD 64' and CD 68 are dielectrics of the oxynitride system $SiO_xN_{1-x}$, and the fractional oxide x of these regions can be identical or can be different. For example, RD 64 and CD 68 can comprise pure oxide (i.e. x=1), and SRD 64' can comprise oxynitride having x=0.9. Further, RD 64, SRD 64' and CD 68 can comprise dielectric having a uniform chemical element or a graded composition on its element. The thicknesses of regions 64, 64' and 68 are typically in the range from about 5 nm to about 20 nm, and can be identical or different from each other. One consideration in selecting the thickness for SRD 64' and RD 64 is a coupling coefficient, which couples voltage from source 95 to CSR 66. It is desired that this coefficient be maximized. This coefficient can be greatly maximized by choosing a thinner thickness for SRD 64'. For example, thickness for RD 64 is preferably in the range from 7 nm to 15 nm, while the thickness for SRD 64' is in the range from 5 nm to 9 nm.

TD 53 and BD 54 can comprise dielectrics having a uniform chemical element or a graded composition on its element. TD 53 and BD 54 can be dielectric materials from the group comprising oxide, nitride, oxynitride, aluminum oxide ("$Al_2O_3$"), hafnium oxide ("$HfO_2$"), zirconium oxide ("$ZrO_2$"), tantalum pen-oxide ("$Ta_2O_5$"). Furthermore, any composition of those materials and the alloys formed thereof, such as hafnium oxide-oxide alloy ("$HfO_2$—$SiO_2$"), hafnium-aluminum-oxide alloy ("HfAlO"), hafnium-oxynitride alloy ("HfSiON") etc. can be used as dielectric materials for TD and BD. In the preferred embodiment, an oxide dielectric having thickness from 2 nm to 4 nm and a nitride dielectric having thickness ranging from about 2 nm to 5 nm are chosen for TD 53 and BD 54, respectively.

The body 70 comprises a semiconductor material of a first conductivity type (e.g. p-type) having doping level in the range of about $1\times10^{15}$ atoms/$cm^3$ to about $1\times10^{18}$ atoms/$cm^3$. The CSR 66, drain 97 and source 95 are with widths typically in the range from about 20 nm to about 200 nm and have depths in similar range. Both drain 97 and source 95 are semiconductor heavily doped by impurity of a second conductivity type (e.g. n-type) having doping level in the range of about $1\times10^{18}$ atoms/$cm^3$ to about $5\times10^{21}$ atoms/$cm^3$. Both drain 97 and source 95 can be materials selected from the group including silicon and single crystal SiGe ("SiGe"), and can comprise same semiconductor as that of the body 70, or alternatively, can comprise semiconductor different from that of the body 70. For example, drain, source and body can comprise same material such as silicon. Alternatively, drain and source can be of SiGe, and body can be of silicon. Typically, SiGe is in the form of pseudomorphic $Si_{1-x}Ge_x$ alloys with Ge mole fraction x ranging from about 5 percent to about 50 percent, and can be grown on silicon substrates using conventional epitaxy techniques.

The buried well 99 comprises a semiconductor material of the second conductivity type (e.g. n-type) having doping level in the range of about $1\times10^{15}$ atoms/$cm^3$ to about $1\times10^{18}$ atoms/$cm^3$. The doping in regions described above may be formed by thermal diffusion or by ion implantation.

The memory cell 100 further comprises means for supplying and transporting energized charge carriers in the drain 97 onto the CSR 66 for program and erase operations of the memory cell. The program operation of memory cell 100 can be done by employing the ballistic-electron injection mechanism as described in connection with FIG. 5. These injection mechanisms inject energized charge carriers having energy distribution with an energy spectrum in the range of about 30 meV to about 300 meV onto CSR 66. For the specific embodiment, typical voltage of TG 61 is chosen in the range of about −3.3 V to about −4.5 V relative to voltage of drain 97 to form a voltage drop therebetween for injecting electrons having tight energy distribution and energy. This can be done, for example, by applying a −1.8 V voltage to WL 92 and a +1.5 V voltage to drain 97 to generate the −3.3 V voltage drop across TG 61 and drain 97. Alternately, it can be done by applying other voltage combinations, such as −1.5 V to WL 92 and +1.8 V to drain 97. The voltage drop across TG 61 and drain 97 can be further lowered by lowering the Image-Force barrier height of the conductor-insulator system 60 as described in connection with FIGS. 1A and 1B. This can be done by coupling a voltage in the range of about 1 V to about 3 V to CSR 66 through applying voltages in the range of about 1 V to about 3.3 V to source 95 and to body 70. For example, assuming 10 nm and 7 nm for the thickness of RD and SRD 64', such Image-Force lowering effect can reduce the −3.3 V voltage drop across TG 61 and drain 97 to a range of about −2.8 V to about −3.0 V.

While applying the voltages for program operation, care is taken to avoid forward-biasing parasitic junctions such as one between buried well 99 and body 70 when employing buried well 99 for isolating body 70 from substrate 98. This is typically done by keeping buried well 99 at voltage level same as or similar to that of the body 70.

The FG $66_{100}$ of CSR 66 is negatively charged with electron carriers after the cell 100 is programmed to a program state. The programmed state of cell 100 is erased by performing the erase operation.

The erase operation can be done by employing the ballistic-hole injection mechanism as described in connection with FIG. 6. These injection mechanisms inject energized charge carriers having energy distribution with an energy spectrum in the range of about 30 meV to about 300 meV onto CSR 66. For the specific embodiment, voltage of TG 61 is chosen in the range of about +5 V to about +6 V relative to voltage of drain 97 to form a voltage drop therebetween for injecting light-holes having tight energy distribution. This can be done, for example, by applying a +3 V voltage to WL 92 and a −2 V voltage to drain 97 to generate the +5 V voltage drop across TG 61 and drain 97. Alternately, it can be done by applying other voltage combinations, such as +2.5 V to WL 92 and −2.5 V to drain.

There are situations where the magnitude of voltage drop across TG 61 and drain 97 for the erase operation is quite different from that for the program operation. For example in the specific embodiment, the magnitude of voltage drop across TG 61 and drain 97 for the erase operation is larger than that for the program operation by about 1.5 V. Generally, it is desired to use means to reduce the differences between these magnitudes. One such means on reducing the voltage magnitude between TG 61 and drain 97 for the erase operation is by employing materials having similar Fermi-level energy for these regions. For example, both TG 61 and drain 97 can comprise a p+ polysilicon. Another such means is by lowering the Image-Force barrier height of the conductor-insulator system 60 as described in connection with FIG. 2. In accordance with one embodiment of the present invention, the Image-Force barrier height is lowered by choosing material for CSR 66 having a larger work-function (or a lower Fermi-level energy) than that of drain 97. For example, p-type polysilicon has a lower Fermi-level energy than that of n-type silicon, and thus a p-type polysilicon and a n-type silicon are considered as one embodiment for materials of CSR 66 and drain 97, respectively. The Image-Force barrier is somewhat lowered when CSR 66 is negatively charged, and is generally further lowered by coupling a voltage in the range of about −1 V to about −3 V to CSR 66 through applying voltages in the range of about −1 V to about −3.3 V to source 95 and body 70. For example, assuming 8 nm for the thickness of RD 64, such Image-Force lowering effect can reduce the +5 V voltage drop across TG 61 and drain 97 to a range of about +4.5 V to about +4.7 V.

During the erase operation, the voltages of buried well 99 can be typically held at ground level when buried well 99 is employed in cell 100 for isolating body 70 from substrate 98.

Finally, to read the memory cell, a read voltage of approximately +1.25 V is applied to its source 95 and approximately +2.5 V (depending upon the power supply voltage of the device) is applied to WL 92. Other regions (i.e. drain 97 and body 70) are at ground potential. If the FG $66_{100}$ is positively charged (i.e. CSR 66 is discharged of electrons), then the channel 96 is turned on. Thus, an electrical current will flow from the source 95 to the drain 97. This would be the "1" state. On the other hand, if the FG $66_{100}$ is negatively charged, the channel 96 is either weakly turned on or is entirely shut off. Even when WL 92 and drain 97 are raised to the read voltage, little or no current will flow through channel 96. In this case, either the current is very small compared to that of the "1" state or there is no current at all. In this manner, the memory cell is sensed to be programmed at the "0" state.

Embodiment 200

Figure 9:
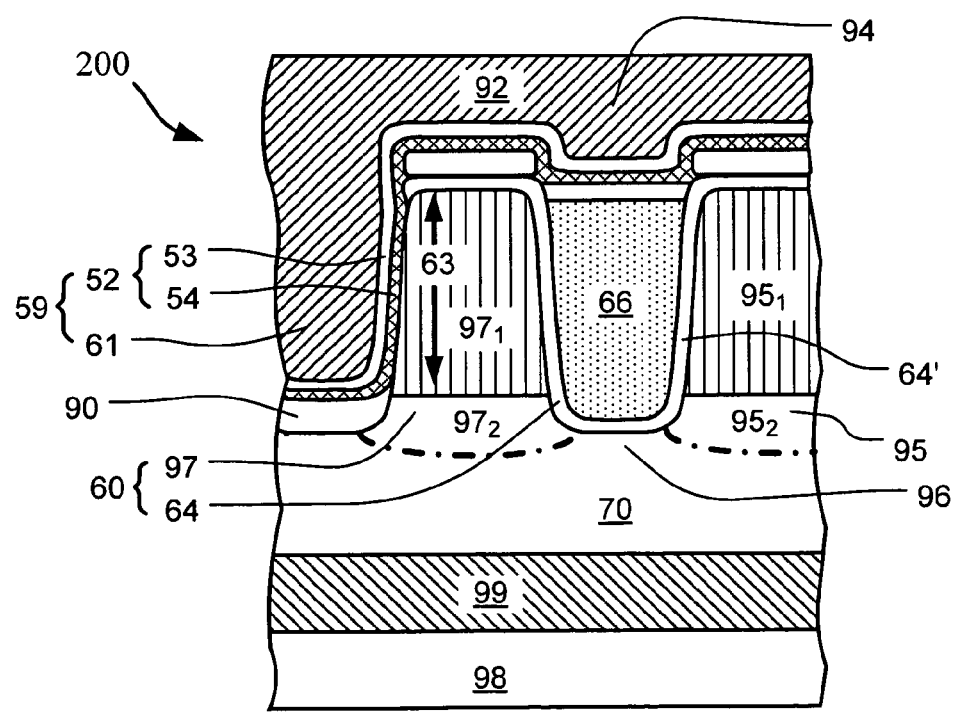
FIG. 9 is the cross sectional view of a cell structure in accordance with another embodiment of the present invention.

Turning now to FIG. 9, some variations of the cell 100 of FIG. 8 are presented in a memory cell 200. The cell 200 is in all respect except two the same as cell 100 of FIG. 8. One of the differences is that instead of having the drain 97 in one region, the cell 200 is provided with the drain 97 having more than one region including a drain connector $97_1$ and a drain junction $97_2$. The drain junction $97_2$ contacts the drain connector $97_1$ and is disposed there under. Likewise, the source 95 has more than one region including a source junction $95_2$ disposed under and contacting a source connector $95_1$ to collectively form the source 95 of cell 200. The source connector $95_1$ and drain connector $97_1$ can be in a rectangular shape having a width and a thickness in the range of about 50 nm to about 500 nm. The drain junction and source junction $97_2$ and $95_2$ are semiconductor regions in the body 70, and are junctions such as p-n junction or metal-semiconductor junction (also termed "Schottky junction") having rectifying function well-known in the art. For an embodiment on p-n junction, the drain and source junctions $97_2$ and $95_2$ are diffusion regions heavily doped by impurity of the second conductivity type (e.g. n-type) having doping level in the range of about $1\times10^{18}$ atoms/cm$^3$ to about $5\times10^{21}$ atoms/cm$^3$. The conductivity type (e.g. n-type) of junctions $97_2$ and $95_2$ are different than the conductivity type (e.g. p-type) of the body 70 to form the p-n junctions for these regions. The doping in these regions may be formed by thermal diffusion or by ion implantation. Typical depths of the source and drain diffusions $95_2/97_2$ into the body 70 are in the range of about 20 nm to about 200 nm. For an embodiment on Schottky junction, the drain and source junctions $97_2$ and $95_2$ are semiconductor having Schottky barrier formed at interface between their respective connectors $97_1$ and $95_1$.

Similar to cell 100, the TG 61 of cell 200 overlaps the drain 97 to form an overlap 63 between the two, where at least a portion of FG $66_{100}$ is disposed adjacent thereto. The range of the overlap 63 can cover a portion of the drain connector $97_1$, an entire portion of the drain connector $97_1$, the entire portion of the drain connector $97_1$ and a portion of the drain junction $97_2$, or an entire portion of the drain $97_1$ including the drain connector $97_1$ and the drain junction $97_2$.

In one embodiment of cell 200, both drain connector $97_1$ and source connector $95_1$ are of semiconductor material such as polysilicon, poly-SiGe, and SiGe having high doping concentration (e.g. doping level of n-type impurities (e.g. arsenic) on the order of $10^{20}$ atoms/cm$^3$). The source connector $95_1$ and drain connector $97_1$ can be formed by using well-known CVD techniques such as LPCVD, RTCVD and the like (for polysilicon and poly-SiGe), or by using expitaxy technique (for SiGe). The doping in these regions may be formed by in-situ, by thermal diffusion or by ion implantation. The source junction $95_2$ and drain junction $97_2$ of cell 200 can be formed in a self-aligned manner to their respective connectors $95_1$ and $97_1$ by out-diffusing impurities from their respective connectors into body 70. For example, the impurity in source connectors $95_1$ can be diffused into body 70 to form the source junction $95_2$ self-aligned to the source connector $95_1$.

In another embodiment of cell 200, both drain connector $97_1$ and source connector $95_1$ are metal, such as aluminum (Al), platinum (Pt), Au, tungsten (W), molybdenum (Mo), ruthenium (Ru), tantalum (Ta), nickel (Ni), tantalum nitride (TaN), titanium nitride (TiN) etc, or alloy thereof. Further, such metal can be silicide or polycide materials such as platinum-silicide, tungsten-silicide, tungsten-polycide, nickel-silicide, cobalt-silicide, etc. The advantages of this embodiment on cell structure are the much lower sheet resistance for the source 95 and drain 97 due to the low sheet resistance of the source and drain connectors $95_1/97_1$. For example, Tungsten-polycide has a sheet-resistance typically about 1 to 10 Ohms/square, and is significantly lower than that in an un-metalized heavily doped polysilicon, whose sheet-resistance is typically about 100 to 300 Ohms/square. The source and drain junctions $95_2$ and $97_2$ of cell 200 can be formed in a self-aligned manner by out-diffusing impurities from their respective connectors $95_1$ and $97_1$. For example, this can be done by ion implanting heavy impurity of the second type conductivity, such as arsenic, into connectors $95_1$ and $97_1$, such as tungsten-polycide, and later followed by thermal treatments to out-diffusing the impurity into body 70. Such approach forms drain and source junctions $97_2$ and $95_2$ of the p-n junction type. Alternatively, the source and drain junctions $95_2$ and $97_2$ of cell 200 can be formed self-aligned to their respective connectors $95_1$ and $97_1$ by forming Schottky barrier at interface between their respective junction and connector. Such approach forms drain and source junctions $97_2$ and $95_2$ of the Schottky junction type, and can be done by choosing materials having proper work-functions for the connectors. For example, for the body having the first conductivity type (p-type), it is desired to select material having a smaller work-function than that of the body 70 as the materials for the connectors $95_1$ and $97_1$. Such materials can form a Schottky barrier for charge of a first polarity type, and can comprise rare earth silicides, such as erbium silicide ("$ErSi_2$"), Terbium silicide ("$TbSi_2$"), and Dysprosium silicide ("$DySi_2$"), or other types of silicide, such as Ytterbium silicide ("$YbSi_2$"). Alternatively, such materials can comprise metal, such as molybdenum. Similarly, for the body having the second conductivity type (n-type), it is desired to select material having a larger working function than that of the body 70 as the materials for the connectors $95_1$ and $97_1$. Such materials can form a Schottky barrier for charge of a second polarity type and can comprise platinum silicide and titanium silicide.

Cell 200 can be operated in similar way as that illustrated for cell 100 in connection with FIG. 8.

The dimensions of the cells in accordance with the present inventions are closely related to the design rules of a given generation of process technology. Therefore, the foregoing dimensions on cells and on regions defined therein are only illustrative examples. In general, however, the dimension of the memory cells must be such that supplied charges are filtered and transported through the filter at a higher absolute voltage between TG and drain (e.g. 3 V to 6 V) and blocked by the filter at a lower absolute voltage (e.g. 2.5 V or lower). Furthermore, the dimensions of the drain 97 and RD 64 must be such that a large portion of filtered charges are allowed to transport through these regions and be collected by the CSR 66 at an injection efficiency typically ranging from about $10^{-6}$ to about $10^{-1}$.

It is to be understood that the present invention is not limited to the illustrated herein and embodiments described above, but encompasses any and all variations falling within the scope of the appended claims. For example, the cell 100 need not having both the conductor-filter system and the conductor-insulator system in cell structure and operations, but rather can have the conductor-filter system or the conductor-insulator system in the cell structure that effectively filter and transport charge carriers to the CSR. Further, the dimension of width of CSR 66 need not be smaller than that of the depth of CSR, but rather can be equal or greater than the dimension of the depth of CSR. Furthermore, the source and drain connectors $95_1$ and $97_1$ need not be a single layer but rather they may comprise more than one layer of materials in architecture. Moreover, the source and drain junctions $95_2$ and $97_2$ need not be formed in a self-aligned manner to their respective connectors $95_1$ and $97_1$, but rather can be formed by using non-self-aligned techniques where alignment between the junctions and their respective connectors relies on masks definition and alignment of those masks. Additionally, both the source 95 and drain 97 need not be having one region or having more than one region in the same call but rather one of the source and drain can have a one region while the other has more than one region. For example, the source 95 of a cell can have one region shown in cell 100 and the drain 97 of the cell can have more than one region, such as drain connector $97_1$ and drain junction $97_2$ shown in cell 200.

Those of skill in the art will recognize that the means for supplying and transporting energized charge carriers that are illustrated for the program and the erase operations of memory cells may be interchanged. For example, the program operation can be done by employing the ballistic-hole injection mechanism, and the erase operation can be done by employing the ballistic-electron injection mechanism.

The memory cells in accordance with the present invention can be formed in an array with peripheral circuitry including conventional row address decoding circuitry, column address decoding circuitry, sense amplifier circuitry, output buffer circuitry and input buffer circuitry, which are well known in the art.

The memory cells of these embodiments are typically arranged in a rectangular array of rows and columns, wherein a plurality of cells are constructed in NOR or NAND architecture well-known in the art. The nonvolatile memory array of the present invention comprises a substrate, and a plurality of nonvolatile memory cells on the substrate and arranged in a rectangular array of rows and columns. Each of the plurality of nonvolatile memory cells comprises a body of a semiconductor material having a first conductivity type, a conductor-filter system including a first conductor 61 having thermal charge carriers and a filter contacting the conductor and including dielectrics for providing a filtering function on the charge carriers of one polarity. The filter includes a first set of electrically alterable potential barriers for controlling flow of the charge carriers of one polarity through the filter in one direction, and a second set of electrically alterable potential barriers for controlling flow of charge carriers of an opposite polarity through the filter in another direction that is substantially opposite to the one direction. Each of the memory cells further comprises a conductor-insulator system including a second conductor 97 having at least a portion thereof contacting the filter and having energized charge carriers from the filter, and a first insulator contacting the second conductor at an interface and having electrically alterable Image-Force potential barriers adjacent to the interface. Moreover, each of the memory cells further comprises a first region 95 spaced-apart from the second conductor 97 with a channel of the body defined there between, a second insulator adjacent to the first region, a charge storage region 66 disposed in between the first and the second insulators; and a third conductor 92' having a first portion 94 disposed over and insulated from the charge storage region 66 and a second portion comprising the first conductor 61 disposed over and insulated from the body.

Figure 10:
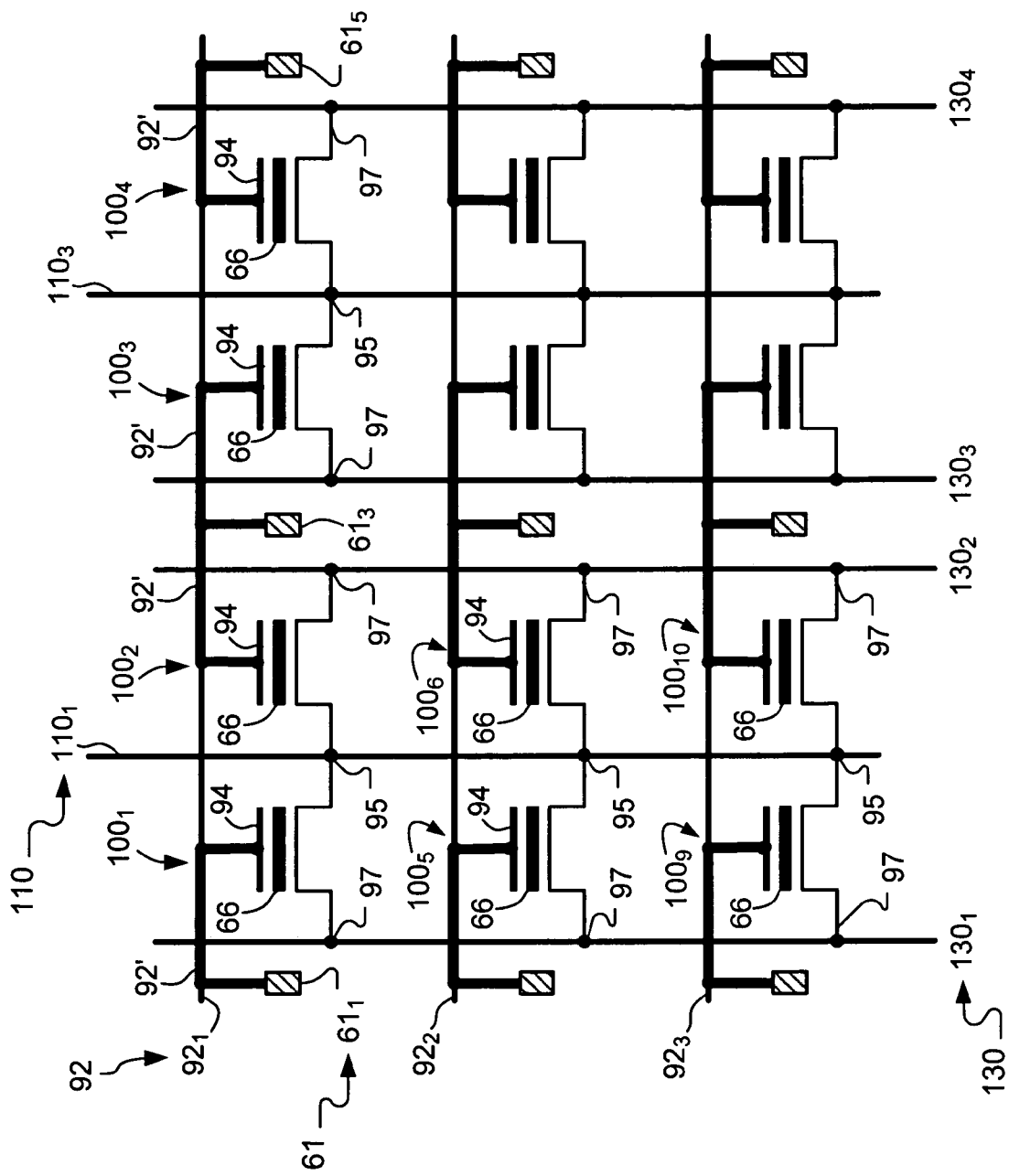
FIG. 10 is the schematics showing array architecture constructed of memory cells in accordance with the present invention.

FIG. 10 illustrates an example on a NOR array architecture in schematic diagram with illustration made on a plurality of memory cells such as $100_1$ to $100_6$, $100_9$ and $100_{10}$ of the memory cell 100 of FIG. 8 type. FIG. 10 shows the nonvolatile memory array further comprising a plurality of word-lines 92, including lines $92_1$, $92_2$, and $92_3$, oriented in a first direction (row direction). Each of the word-lines 92 is shown connecting all the third conductors 92' of memory cells in the same row. For example, the word-line $92_1$ connects the third conductors 92' of each of the memory cells in the uppermost row such as cells $100_1$, $100_2$, $100_3$ and $100_4$. Further, there is shown a plurality of source-lines 110, including lines $110_1$ and $110_3$, and a plurality of bit-lines 130, including lines $130_1$, $130_2$, $130_3$ and $130_4$, all oriented in a second direction (column direction). Each of the bit-lines 130 connects all the drains 97 of memory cells in the same column. Thereby, the bit-line $130_1$ connects the drain 97 of each of the memory cells in the leftmost column including cells $100_1$, $100_5$ and $100_9$. Likewise, each of the source-lines 110 connects all the sources 95 of memory cells in the same column. For example, the source-line $110_1$ connects the source 95 of each of the memory cells in the leftmost column including cells $100_1$, $100_5$ and $100_9$. Memory cells in one column share a single source-line 110 with memory cells in an adjacent column to form a column of multiple pairs of memory cells that mirror each other ("mirror cells"). For example, cells $100_1$ and $100_2$ forms one pair of mirror cells and cells $100_5$ and $100_6$ forms another pair of mirror cells that are in the same column as the one pair of mirror cells. Thereby, each pair of mirror cells shares a single source 95 therebetween and has their drain 97 and TG 61 on either side of the mirror cells. One cell of one cell pair of mirror cells in one column and one cell of another cell pair of mirror cells in a same row and in an adjacent column share a single TG 61 therebetween. For example, memory cell 100$_2$ shares TG 61$_3$ with memory cell 100$_3$. TG 61 of each of the memory cells in the same row are connected together through one of the word-lines 92. For example, the word-line 92$_1$ connects TG, including 61$_1$, 61$_3$, and 61$_5$, of memory cells in the uppermost row such as cells 100$_1$, 100$_2$, 100$_3$ and 100$_4$.

Those of skill in the art will recognize that the term source and drain may be interchanged, and the source- and drain-lines or source- and bit-lines may be interchanged. Further, the word-line is connected to TG 61 of the memory cell. Thus, the term TG, TG line may also be used interchangeably with the term word-line.

The NOR array shown in FIG. 10 is an array architecture used as an example to illustrate the array formation using memory cells of the present invention. It should be appreciated that while only a small segment of array region is shown, the example in FIG. 10 illustrates any size of array of such regions. Additionally, the memory cells of the present invention can be applied to other types of NOR array architecture. For example, while each of the source-lines 110 is arranged to share for cells on one column with cells on an adjacent column, a memory array can be arranged with cells on each column having their own dedicated source-line. Furthermore, although the present invention is illustrated in a single cell and in a NOR array, it should be apparent to those of ordinary skill in the art that a plurality of cells of the present invention can be arranged in a rectangular array of rows and columns, wherein the plurality of cells are constructed in AND, NAND array architectures well-known in the art or a combination of a NAND, AND, and a NOR array structure.

For memory cells in accordance with the present inventions, it should be noted that both program and erase operations can be done with absolute bias at a level less than or equal to 3.3V. Furthermore, the erase mechanism and cell architecture enable the individually erasable cells feature, which is ideal for storing data such as constants that required periodically changed. The same feature is further extendable to small group of such cells which are erased simultaneously (e.g. cells storing a digital word, which contains 8 cells). Additionally, the same feature is also further extendable to such cells which are erasable simultaneously in large group (e.g. cells storing code for software program, which can contain 2048 cells configured in page, or contain a plurality of pages in block in array architecture).

Methods of Manufacturing

The present invention further provides self-alignment techniques and manufacturing methods to form memory cells and memory array with illustration made on cell of the FIG. 8 type (cell 100) and on array of the FIG. 10 type. While illustration is made on cell 100, such illustration is only by way of example and can be readily modified and applied to other cells such as cell 200 in accordance with the present invention. As will be appreciated, reference indicators throughout the drawings are shown only in a few places of identical regions in order not to overcomplicate the drawings.

Figure 11:
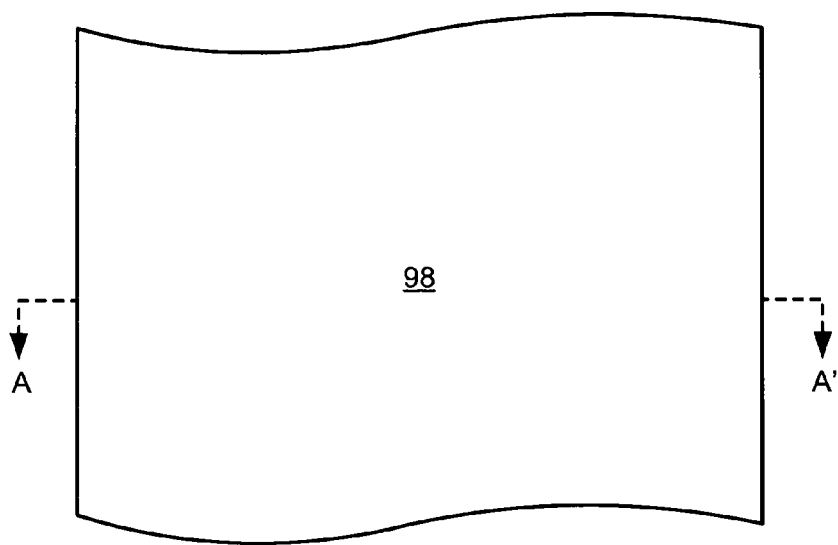
FIG. 11 is a top view of a semiconductor substrate used in the first step of the method of manufacturing memory cells in present invention.
Figure 11A:
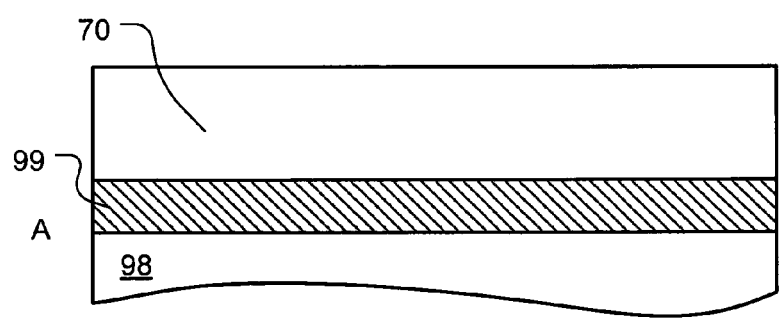
FIG. 11A is a cross sectional view of the structure taken along the line AA' in FIG. 11.

Referring to FIG. 11 there is shown a top plan view of a semiconductor substrate 98 used as the starting material for forming memory cells and array. A cross-sectional view along lines AA' of FIG. 11 for the material thus described is shown in FIG. 11A, wherein the substrate 98 is preferably a silicon of a first conductivity type (e.g. p-type). A body 70 is formed in the substrate 98 by well-known techniques such as ion implantation, and is assumed having the first conductivity type. The body 70 thus formed comprises same semiconductor material as that of the substrate 98. Alternatively, the body 70 can be formed by growing a semiconductor layer having at least a portion thereof different from that of the substrate by using conventional epitaxy technique. For example, body 70 can be a single crystal SiGe ("SiGe") layer formed on a silicon substrate 98. Alternatively, using the epitaxy technique, body 70 can be formed to comprise a lower portion of same material as the semiconductor substrate 98 and an upper portion of a different material as the semiconductor substrate 98. For example, the upper portion of body 70 can be a SiGe layer, and the lower portion of body 70 can be silicon formed on a silicon substrate 98. The body 70 can be optionally isolated from the substrate 98 by a semiconductor region such as buried well 99 having a second type of conductivity (e.g. n-type). The buried well 99 can be formed by well-known techniques such as ion implantation.

With the structure shown in FIG. 11A, the structure is further processed as follows. A first insulator 132 is formed over the substrate 98 with thickness preferably at about 20 nm to about 50 nm. The insulator can be, e.g., oxide deposited by employing conventional thermal oxidation, by HTO, by TEOS deposition processes using CVD techniques, or by in-situ steam generation ("ISSG") growth techniques well-known in the art. The insulator 132 typically is in a single layer form. Next a layer of dielectric 134 such as nitride is deposited over the structure using, for example, conventional LPCVD technique. The thickness of dielectric 134 is preferably at about 10 nm to about 80 nm.

Next, a photo-resistant material ("photo-resist" hereinafter) on the structure surface is suitably applied followed by a masking step using conventional photo-lithography technique to selectively remove the photo-resist leaving a plurality of photo-resist line traces oriented in the second direction (column direction) over the dielectric 134. The process is continued by etching the exposed dielectric 134 followed by etching the exposed first insulator 132 until the substrate 98 is observed, which acts as an etch stop. Well-known etching techniques such as Reactive-Ion-Etch ("RIE") can be employed for this etching step. The portions of dielectric 134' and first insulator 132 still underneath the remaining photo-resist are unaffected by this etch process. This step forms a plurality of dielectric lines 134a orientated in the second direction (or "column direction"). The structure is further processed by etching the exposed substrate 98 to form a plurality of first trenches 136 each having sidewalls 137. The step also forms a plurality of first trench lines 136a orientated in the second direction (or "column direction") with each pair of them spaced apart by one of the dielectric lines 134a. The width of the dielectric lines 134a and the distance between adjacent dielectric lines can be as small as the smallest lithographic feature of the process used. The remaining photo-resist is then removed using conventional means. The top plan view of the resulting structure is shown in FIG. 12 and the cross-sectional views along lines AA' of the resulting structure is illustrated in FIG. 12A.

An ion implant step is then performed to dope the exposed substrate region 98 with impurities of the second type of conductivity (n-type) to form diffusion regions 138 along sidewall 137 self-aligned to the first trench 136. FIG. 13 illustrates a cross-sectional view along lines AA' of FIG. 12 for such ion implant step. Typically, the ion implant is performed by tilting ion beams 135 at a large angle 133 in either side of a normal 139 of the substrate 98. Such diffusion regions 138 are used to form the source 95 and drain 97 of memory cell, described in connection with FIG. 8, and to form bit-lines 130 and source-lines 110 of the memory array, described in connection with FIG. 10. The diffusion regions 138 are orientated in the second direction (or "column direction") with each pair of them spaced apart by the first trench 136. The width of the diffusion regions 138 and the distance between adjacent diffusions 138 can be as small as the smallest lithographic feature of the process used. An optional ion implant step can be performed with current beam aligned along the normal 139 to dope body 70 adjacent to bottom of trenches 136 with impurities of the first conductivity type (p-type). Proper thermal treatments such as Rapid-Thermal Annealing (RTA) technique are then applied to the structure to remove damages caused by the ion implant and to redistribute the impurities in diffusion regions 138.

The process is continued by forming a second insulator layer 140 over the exposed first trench 136 with thickness preferably at about 5 nm to about 50 nm. The insulator 140 can be, for example, oxide formed by conventional thermal oxidation or by ISSG growth techniques, or can be HTO or TEOS deposited by conventional CVD techniques. The insulator can be in single layer form or in composite layers form with other types of insulators such as nitride, oxynitride and FSG. The second insulator 140 merges with the first insulator 132 at upper edges 137' of the trench sidewall 137.

Figure 14:
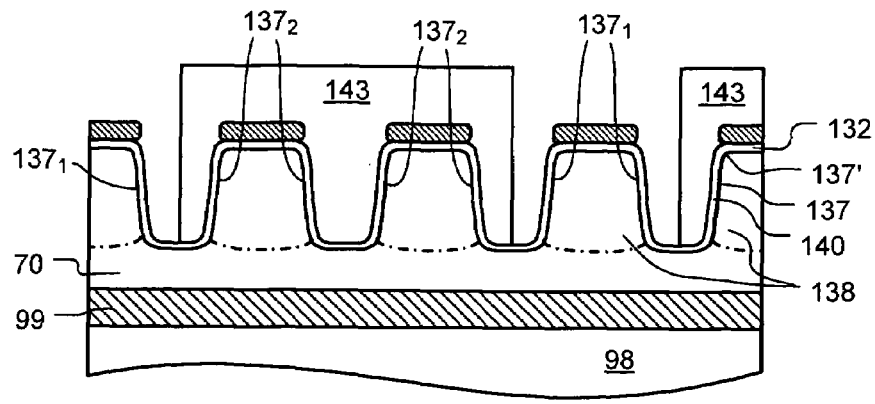

The insulator 140 in various regions of trenches 136 can be formed to have one thickness and one chemical composition or can be optionally formed to have more than one thickness or more than one chemical composition. FIG. 14 shows one example on the method for forming insulator 140 having more than one thickness or more than one chemical composition. The method includes forming a photo-resist 143 using conventional photo-lithography technique over the structure to selectively cover insulator 140 on sidewalls such as $137_2$ in one portion of trenches 136 and expose insulator 140 on sidewalls such as $137_1$ in another portion of trenches 136. The method is continued by applying an etching step, such as a wet etch of diluted HF acid, to remove the portion of insulator 140 in the exposed regions. The unexposed portions of insulator 140 still underneath the remaining photo-resist 143 are unaffected by this etch process. The structure is further processed by removing the photo-resist 143, followed by forming insulator 140 in the exposed region using techniques such as CVD or thermal oxidation. The second insulator 140 thus formed includes a portion $140_1$ in the exposed regions and a portion $140_2$ in the unexposed region, wherein both portions $140_1$ and $140_2$ have different thicknesses and/or chemical compositions. Typically, the portion $140_2$ of the insulator 140 in the exposed regions is thicker than the portion $140_1$ of insulator 140 in the unexposed region. The insulator 140 is used primarily for forming the RD 64 and SRD 64' of the memory cells in accordance with the present invention.

Figure 15:
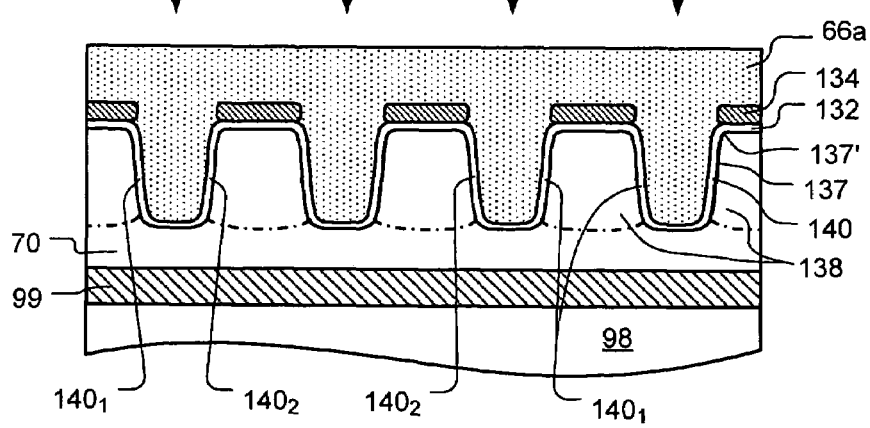

Next a layer of conductive material 66a such as polysilicon is deposited over the structure using, for example, conventional LPCVD technique with polysilicon film doped in-situ or by a subsequent ion implant. The conductive material 66a is for forming CSR 66 of memory cells. Typically, the conductive material 66a is with a thickness thick enough to fill the first trenches 136 and can be on the order of, for example, about 20 nm to 200 nm. Preferably, the topography of the conductive material 66a thus formed is substantially planar, and an optional planarization process such as chemical-mechanical polishing ("CMP") can be used for achieving the planar topography. It should be noted that polysilicon is chosen for material 66a for illustration purpose (due to process simplicity). In general, any other conductive materials that have a good trench-gap filling capability and stable material property at high temperature (e.g. 900° C.) can be employed instead. The cross-sectional views along lines AA' of FIG. 12 for the resulting structure is illustrated in FIG. 15.

Next, a planarization step follows (preferably CMP) to etch the conductive material 66a down to the dielectric 134, leaving blocks of the conductive material 66a in first trenches 136. An etch-back step follows to recess the top portion of blocks of conductive material 66a below the tops of the dielectric 134. An oxide layer 93a is then formed on top of each of blocks of the conductive material 66a by employing conventional thermal oxidation, HTO, TEOS or ISSG deposition techniques or a combination thereof. For example, assuming polysilicon be the conductive material 66a, oxide layer 93a can be formed by oxidizing the top portion of the polysilicon followed by depositing a HTO layer there over. The oxide layer 93a can have a thickness in the range of about 5 nm to about 20 nm. The process is continued by forming a coupling dielectric 142, such as nitride, with thickness preferably in the range of about 3 nm to about 15 nm over the oxide layer 93a. The dielectric 142 of nitride can be deposited by LPCVD technique well-known in the art. Typically, any other types of dielectrics (e.g. $Al_2O_3$, $HfO_2$ etc.) having dielectric constant higher than that of oxide and having material properties compatible to semiconductor manufacturing can be considered for the coupling dielectric 142.

Figure 16:
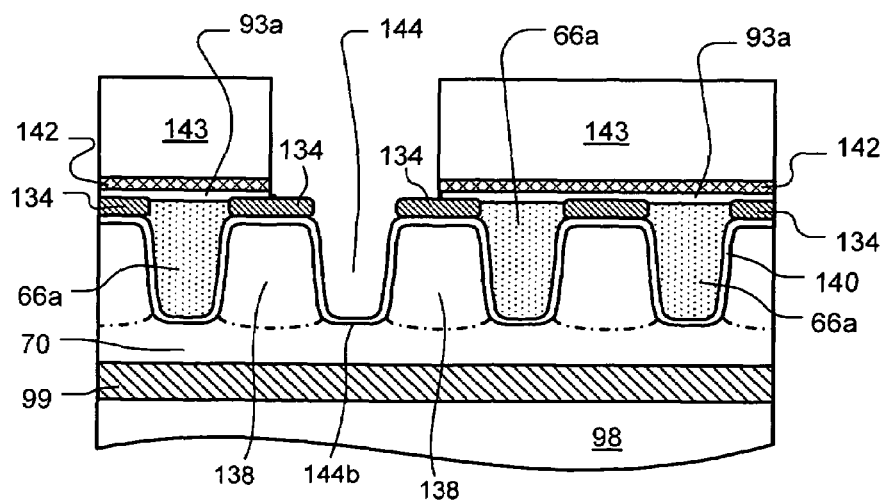

Next, a photo-resist on the structure surface is suitably applied followed by a masking step using conventional photo-lithography technique to selectively remove the photo-resist leaving a plurality of photo-resist line traces 143 oriented in the second direction (column direction) over the dielectric 142. The process is continued by etching the exposed dielectric 142 followed by etching the exposed oxide layer 93a until the insulator 134 and the block of conductive material 66a that are uncovered by the photo-resist 143 are observed, which act as etch stops. The portions of layers 142 and 93a still underneath the remaining photo-resist 143 are unaffected by this etch process. An etching step follows to etch the exposed conductive material 66a in the first trench 136 until the second insulator 140 is observed, which acts as an etch stop. This step removes the exposed conductive material 66a in the first trench 136 to form a plurality of WL trenches 144 oriented in the second direction (column direction) with each of them interlaced with a photo-resist line trace 143. An optional ion implantation can be performed to dope the portion of body 70 adjacent to a bottom 144b of the WL trench 144 with impurities of the first conductivity type. This step forms a field-stopper (not shown) self-aligned to the WL trench 144 to prevent diffusions 138 on either side of WL trench 144 from shorting each other. The cross-sectional views along lines AA' of FIG. 12 for the resulting structure is illustrated in FIG. 16.

Figure 17:
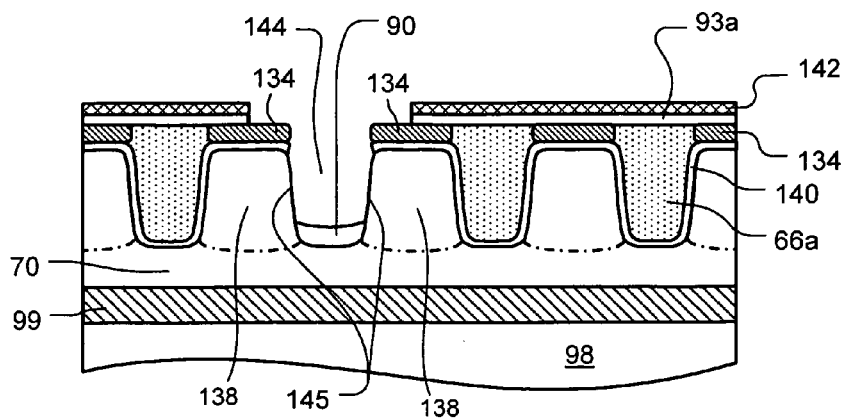

The process is continued by removing the remained photo-resist line traces 143. Next, a layer of oxide is formed over the structure to fill the WL trenches 144. Typically, the layer of oxide is with a thickness thick enough to fill the WL trenches 144 and can be on the order of, for example, about 20 nm to 300 nm. Preferably, the topography of the oxide layer thus formed is substantially planar. The step is followed by a planarization process (e.g. CMP) and an etch-back process (e.g. RIE) to recess the top portion of the oxide layer to a level below the tops of the WL trench 144. Dielectric 142 and the exposed portion of dielectric 134 act as etching mask for the etch-back process. This step forms block of field oxide ("FOX") 90 in a lower portion of and self-aligned to the WL trench 144. The FOX 90 provides the effect on preventing diffusions 138 on either side of WL trench 144 from shorting each other during memory operations. The second insulator 140 on sidewalls 145 of the WL trench 144 is removed during the same step. An optional wet etch (e.g. diluted HF acid for second insulator 140 of oxide) is then followed to remove any residues for a thorough cleaning of the second insulator 140. The cross-sectional views along lines AA' of FIG. 12 for the resulting structure is illustrated in FIG. 17.

Figure 18:
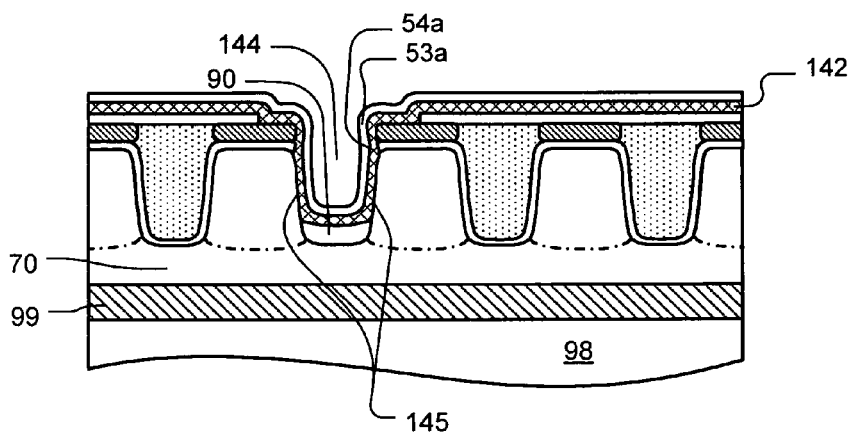

Next, a filter 52 is formed over the structure. In a specific embodiment, a third insulator 54a and a fourth insulator 53a are considered for the filter 52. The third insulator layer 54a such as nitride is formed over the structure by employing thermal nitridation such as rapid-thermal-nitridation (RTN) in $NH_3$ ambient at 1050 C. The third insulator 54a has a thickness preferably at about 2 nm to about 6 nm. In region external to the WL trench 144, the third insulator 54a is merged with the coupling dielectric 142 as one layer. The process is continued by forming the fourth insulator layer 53a such as oxide over the third insulator 54a. The fourth insulator can be formed by using thermal oxidation, HTO, TEOS, or ISSG techniques well-known in the art. HTO, which is typically formed with chemistry containing dichlorosilane ($SiCl_2H_2$) and nitrous oxide ($N_2O$), has a good film quality and a good conformity to structure topography and hence is a more preferable material for the fourth insulator 53a. The fourth insulator 53a has a thickness preferably in the range of about 2 nm to about 4 nm. Both the third and fourth insulator layers 54a and 53a are also formed inside the WL trench 144 including over the sidewalls 145. The third and fourth insulator layers 54a and 53a are used as BD 54 and TD 53, respectively, of the memory cells in accordance with the present invention. The cross-sectional views along lines AA' of FIG. 12 for the resulting structure is illustrated in FIG. 18.

The process is continued by forming a layer of conductive material 92a such as polysilicon over the structure using, for example, conventional LPCVD technique with polysilicon film doped in-situ or by a subsequent ion implantation. The conductive material 92a is for forming word-lines 92 of memory cells and array. The portion of WL 92 over the WL trench 144 fills the WL trench 144 to form TG 61 of memory cells. Typically, the conductive material 92a is with a thickness thick enough to fill the WL trenches 144 and can be on the order of, for example, about 50 nm to 500 nm. Preferably, the topography of the conductive material 92a thus formed is substantially planar, and an optional planarization process (i.e. CMP) can be used for achieving the planar topography. It should be noted that polysilicon is chosen for material 92a for illustration purpose (due to process simplicity). In general, any other conductive materials that have a low sheet resistance, a good trench-gap filling capability, and stable material property at high temperature (e.g. 900° C.) can be employed instead. For example, a metalized polysilicon layer such as polysilicon with tungsten-polycide atop can be employed for the conductive layer 92a by using well-known CVD technique. Tungsten-polycide has a sheet-resistance typically about 1 to 10 Ohms/square, and is significantly lower than that in an un-metalized heavily doped polysilicon, whose sheet-resistance is typically about 100 to 300 Ohms/square. Other conductors that are readily available in semiconductor manufacturing, such as platinum-silicide, nickel-silicide, cobalt-silicide, titanium-silicide, TiN, TaN etc., can also be considered as conductive layer 92a. Further, such types of conductors can be formed atop of polysilicon to form a composite conductor for use as layer 92a.

Figure 19:
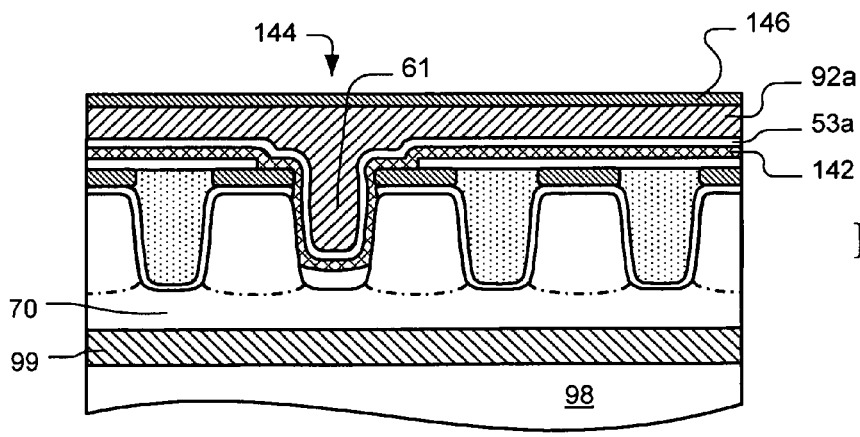

The process is continued by forming a layer of dielectric 146 such as nitride over the structure using, for example, conventional LPCVD technique. The thickness of dielectric 146 is preferably at about 10 nm to about 80 nm. The cross-sectional views along lines AA' of FIG. 12 for the resulting structure is illustrated in FIG. 19.

Next, a photo-resist on the structure surface is suitably applied followed by a masking step using conventional photo-lithography technique to selectively remove the photo-resist leaving a plurality of photo-resist line traces oriented in the first direction (row direction) over the dielectric layer 146.

The process is continued by etching the exposed dielectric layer 146 followed by etching the exposed conductive material 92a until the fourth insulator 53a is observed, which acts as an etch stop. This step also exposes the portion of conductive material 92a in the WL trench 144. The portions of layer 92a underneath the remaining photo-resist are unaffected by this etch process. A sequence of etching steps is then performed to remove the fourth insulator 53a, the third insulator 54a, the dielectric 142 and the oxide layer 93a in regions uncovered by the photo-resist until conductive material 66a in the first trenches 136 is observed, which acts as an etch stop. The structure is further processed by applying an etching step to remove the exposed conductive materials 92a and 66a until the second insulator 140 in first trench 136 and the fourth insulator 53a in WL trench 144 are observed. This step forms a plurality of CSR 66 arranged in rows and columns. Additionally, this step forms a plurality of word lines 92 orientated in the first direction (or "row direction") with each pair of them spaced apart by a second trench 148. The width of the word-lines 92 and the distance between adjacent word-lines can be as small as the smallest lithographic feature of the process used.

The remaining photo-resist is then removed using conventional means. The top plan view of the resulting structure is shown in FIG. 20 with word-lines 92 interlaced with the second trenches 148. Also shown are the array of CSR 66 and the diffusions 138 described in connection with FIG. 13. The cross-sectional views along lines AA', BB', CC', DD' and EE' of the resulting structure are collectively illustrated in FIGS. 20A, 20B, 20C, 20D and 20E, respectively.

The process is continued by optionally forming a sidewall insulating layer 150 such as oxide on sidewalls of word-lines 92, including TG 61, and on sidewalls of CSR 66 exposed to the second trench 148. The oxide can be formed by, for example, performing a thermal oxidation step using rapid-thermal-oxidation (RTO) technique, and can have a thickness at about 2 nm to about 8 nm. Next, a relative thick dielectric layer (e.g. oxide) is formed to fill the second trenches 148 by using well-known techniques such as conventional CVD techniques. The oxide dielectric is with a thickness, for example, in the range from about 20 nm to 500 nm. The oxide dielectric is then selectively removed to leave oxide blocks 152 in region within the trenches 148. The preferable structure is with the top surface of the oxide blocks 152 substantially co-planar with the top surface of the nitride dielectric 146. This can be done by, for example, employing a chemical-mechanical polishing (CMP) process to planarize the thick oxide followed by an RIE (reactive ion etch) using nitride dielectric 146 as a polishing and/or etching stopper. An optional oxide over-etching step follows if necessary to clear any oxide residue on the nitride dielectric 146. Thereby, the process leaves oxide only in trenches 148 to form oxide blocks 152 self-aligned to the second trenches 148. The top plan view of the resulting structure is illustrated in FIG. 21 with word-lines 92 interlaced with the oxide blocks 152. The cross-sectional views along lines AA', BB', CC', DD', and EE' of the resulting structure are collectively illustrated in FIGS. 21A, 21B, 21C, 21D and 21E.

The resulting structure of FIG. 21 comprises various components for the array of FIG. 10 type. Referring to FIG. 21, there are shown a plurality of memory cells, including cells 100$_2$, 100$_3$, 100$_4$ and 100$_6$, arranged in rows and columns, a plurality of word-lines 92, including word-lines 92$_1$, 92$_2$, and 92$_3$, and a plurality of diffusions 138, including bit-lines $130_2$, $130_3$ and $130_4$, and source-lines $110_1$ and $110_3$. FIG. 21A also shows various regions of a memory cell such as cell $100_3$ of the FIG. 8 type (cell 100). The bit-line $130_3$ and the source-line $110_3$ also represent the drain 97 and source 95 they respectively connected to. Further, there are shown CD 68, CSR 66, conductor-insulator system 60 including drain 97 and RD 64, filter 52 including BD 54 and TD 53, and WL 92 including TG 61. All these regions are identical to their respective regions in cell 100 described in connections with FIG. 8.

The structure of FIG. 21 is completed by employing conventional passivation and metallization processes well-known in the arts. These processes include forming a passivation layer, such as BPSG, and forming contacts and metal lines over the structure to make electrical connections to various regions of cells and array, including word-lines 92, bit-lines and source-lines 130 and 110, body 70, buried well 99, and substrate 98.

Although the manufacturing methods are shown with process steps in current order, it should be clear to those of ordinary skill in the art having the benefit of this disclosure that not all process steps need be performed in the exact order, but rather in any order that properly form the memory cells and array of the present invention. Further, CSR of the present invention need not be in rectangular shape in their top view, need not be in rectangular in their cross-sections, but rather can be any size and shape in their top view and in their cross-sections that effectively store charges and effectively connects the drain and source in each memory cell. Additionally, the top and the bottom surface of filter need not be parallel, need not be flat, need not be co-planar with the substrate surface, but rather can be at any level under or above the substrate surface, in any angle with the substrate surface, and with other shape that can effectively perform the filtering functions.

The invention claimed is:

1. A memory cell comprising:
 a body of a semiconductor material having a first conductivity type;
 a conductor-filter system including:
  a first conductor having thermal charge carriers; and
  a filter contacting the first conductor and including dielectrics for providing a filtering function on thermal charge carriers of one polarity, wherein the filter includes:
   a first set of electrically alterable potential barriers for controlling flow of the thermal charge carriers of one polarity through the filter in one direction;
 a conductor-insulator system including:
  a second conductor having at least a portion thereof contacting the filter and having energized charge carriers from the filter; and
  a first insulator contacting the second conductor at an interface and having a second set of electrically alterable potential barriers adjacent to the interface;
 a first region spaced-apart from the second conductor with a channel of the body defined there between;
 a second insulator adjacent to the first region;
 a charge storage region disposed in between the first and the second insulators; and
 a word-line of a conductor having:
  a first portion disposed over and insulated from the charge storage region, and
  a second portion comprising the first conductor disposed over and insulated from the body.

2. The memory cell of claim 1, wherein the filter further includes a third set of electrically alterable potential barriers for controlling flow of thermal charge carriers of an opposite polarity through the filter in another direction that is substantially opposite to the one direction.

3. The memory cell of claim 1, wherein the filter comprises:
 a first dielectric disposed adjacent to the first conductor and having an energy band gap; and
 a second dielectric disposed adjacent to the first dielectric, wherein the second dielectric has an energy band gap narrower than the energy band gap of the first dielectric.

4. The memory cell of claim 3, wherein the first dielectric has a first dielectric constant and the second dielectric has a dielectric constant that is substantially greater than the first dielectric constant.

5. The memory cell of claim 3, wherein the first dielectric has a first dielectric constant and a first thickness and the second dielectric has a second dielectric constant and a second thickness, and wherein a product of the second dielectric constant and the first thickness is substantially greater than a product of the first dielectric constant and the second thickness.

6. The memory cell of claim 3, wherein the first dielectric comprises oxide having a thickness in a range of about 1.5 nm to about 4 nm, and the second dielectric comprises material selected from the group consisting of nitride, oxynitride, $Al_2O_3$, $HfO_2$, $TiO_2$, $ZrO_2$, $Ta_2O_5$, and alloys formed thereof.

7. The memory cell of claim 3, wherein the first dielectric comprises oxynitride having a thickness in a range of about 1.5 nm to about 4 nm, and the second dielectric comprises material selected from the group consisting of nitride, $Al_2O_3$, $HfO_2$, $TiO_2$, $ZrO_2$, $Ta_2O_5$, and alloys formed thereof.

8. The memory cell of claim 1, wherein the charge storage region comprises conductive material having a larger work-function than a work-function of the second conductor.

9. The memory cell of claim 8, wherein the charge storage region comprises p-type polysilicon and the second conductor comprises n-type silicon.

10. The memory cell of claim 1, wherein the first region comprises a semiconductor material having a second conductivity type.

11. The memory cell of claim 1, wherein the second conductor comprises a semiconductor material having a second conductivity type.

12. The memory cell of claim 1, wherein the body comprises silicon, and the first region and the second conductor comprises a semiconductor material selected from the group including silicon, and SiGe.

13. The memory cell of claim 1, wherein the first region comprises a first connector and a first junction.

14. The memory cell of claim 13, wherein the first connector and the first junction are formed in a self-aligned manner.

15. The memory cell of claim 13, wherein the first junction comprises junction selected from the group consisting of p-n junction and Schottky junction.

16. The memory cell of claim 13, wherein the first connector comprises material selected from the group including polysilicon, poly-SiGe, SiGe, Al, Pt, Au, W, Mo, Ru, Ta, Ni, TaN, TiN, platinum-silicide, titanium silicide, tungsten-silicide, tungsten-polycide, nickel-silicide, cobalt-silicide, erbium silicide, terbium silicide, dysprosium silicide, and ytterbium silicide.

17. The memory cell of claim 1, wherein the second conductor comprises a second connector and a second junction.

18. The memory cell of claim 17, wherein the second connector and the second junction are formed in a self-aligned manner.

19. The memory cell of claim 17, wherein the second junction comprises junction selected from the group consisting of p-n junction and Schottky junction.

20. The memory cell of claim 17, wherein the second connector comprises material selected from the group including polysilicon, poly-SiGe, SiGe, Al, Pt, Au, W, Mo, Ru, Ta, Ni, TaN, TiN, platinum-silicide, titanium silicide, tungsten-silicide, tungsten-polycide, nickel-silicide, cobalt-silicide, erbium silicide, terbium silicide, dysprosium silicide, and ytterbium silicide.

21. The memory cell of claim 1, wherein the word-line comprises material selected from the group including n+ polysilicon, p+ polysilicon, poly-SiGe, Al, Pt, Au, W, Mo, Ru, Ta, Ni, TaN, TiN, and alloy formed thereof.

22. The memory cell of claim 1, further comprising a buried well of a semiconductor material having a second conductivity type and disposed in between the body and a substrate.

23. The memory cell of claim 1, wherein the energized charge carriers has an energy distribution with an energy spectrum in the range of about 30 meV to about 300 meV.

24. The memory cell of claim 1, wherein the first and the second insulators comprise dielectrics of the oxynitride system $SiO_xN_{1-x}$.

25. The memory cell of claim 1, wherein a thickness of the second insulator is thinner than a thickness of the first insulator.

26. A memory cell comprising:
a body of a semiconductor material having a first conductivity type;
a conductor-filter system including:
a first conductor having thermal charge carriers; and
a filter contacting the first conductor and including dielectrics for providing a filtering function on thermal charge carriers of one polarity, wherein the filter includes:
a first set of electrically alterable potential barriers for controlling flow of the thermal charge carriers of one polarity through the filter in one direction, and
a second set of electrically alterable potential barriers for controlling flow of thermal charge carriers of an opposite polarity through the filter in another direction that is substantially opposite to the one direction;
a conductor-insulator system including:
a second conductor having at least a portion thereof contacting the filter and having energized charge carriers from the filter; and
a first insulator contacting the second conductor at an interface and having a third set of electrically alterable potential barriers adjacent to the interface;
a first region spaced-apart from the second conductor with a channel of the body defined there between;
a second insulator adjacent to the first region;
a charge storage region disposed in between the first and the second insulators;
a word-line of a conductor having:
a first portion disposed over and insulated from the charge storage region, and
a second portion comprising the first conductor disposed over and insulated from the body; and
means for transporting the energized charge carriers over the third set of electrically alterable potential barriers onto the charge storage region.

27. The memory cell of claim 26, wherein the means is the ballistic-hole injection mechanism and wherein the energized charge carriers are ballistic light-holes.

28. The memory cell of claim 26, wherein the means is the ballistic-electron injection mechanism and wherein the energized charge carriers are ballistic electrons.

29. The memory cell of claim 26, wherein the energized charge carriers has an energy distribution with an energy spectrum in the range of about 30 meV to about 300 meV.

30. A nonvolatile memory array comprising:
a substrate;
a plurality of nonvolatile memory cells on the substrate, and arranged in a rectangular array of rows and columns, each of the plurality of nonvolatile memory cells comprising:
a body of a semiconductor material having a first conductivity type;
a conductor-filter system including:
a first conductor having thermal charge carriers; and
a filter contacting the conductor and including dielectrics for providing a filtering function on thermal charge carriers of one polarity, wherein the filter includes:
a first set of electrically alterable potential barriers for controlling flow of the thermal charge carriers of one polarity through the filter in one direction, and
a second set of electrically alterable potential barriers for controlling flow of thermal charge carriers of an opposite polarity through the filter in another direction that is substantially opposite to the one direction;
a conductor-insulator system including:
a second conductor having at least a portion thereof contacting the filter and having energized charge carriers from the filter; and
a first insulator contacting the second conductor at an interface and having a third set of electrically alterable potential barriers adjacent to the interface;
a first region spaced-apart from the second conductor with a channel of the body defined there between;
a second insulator adjacent to the first region;
a charge storage region disposed in between the first and the second insulators; and
a third conductor having:
a first portion disposed over and insulated from the charge storage region, and
a second portion comprising the first conductor disposed over and insulated from the body.

31. The nonvolatile memory array of claim 30, further comprising:
a plurality of word-lines oriented in a first direction;
a plurality of source-lines oriented in a second direction; and
a plurality of bit-lines oriented in the second direction,
wherein each of the word-lines connects the third conductor of each of the memory cells in a same row, each of the bit-lines connects the second conductor of each of the memory cells in a same column, and each of the source-lines connects the first region of each of the memory cells in a same column.

32. The nonvolatile memory array of claim 30, wherein the memory cells are formed as pairs of memory cells having each of the memory cell pairs sharing a single first region therebetween.

33. The nonvolatile memory array of claim 30, wherein the memory cells are formed as pairs of memory cells, and wherein one cell of one cell pair in one column and one cell of another cell pair in a same row and in an adjacent column shares a single first conductor therebetween.

34. The nonvolatile memory array of claim 30, wherein the substrate comprises a semiconductor material having a first conductivity type, and the nonvolatile memory array further comprising a buried well of a semiconductor material having a second conductivity type disposed in between the body of each of memory cells and the substrate.

* * * * *